(12) United States Patent
Inoue et al.

(10) Patent No.: US 9,349,844 B2
(45) Date of Patent: May 24, 2016

(54) SEMICONDUCTOR DEVICE MANUFACTURING METHOD

(71) Applicant: Renesas Electronics Corporation, Kanagawa (JP)

(72) Inventors: Naoya Inoue, Kanagawa (JP); Kishou Kaneko, Kanagawa (JP); Yoshihiro Hayashi, Kanagawa (JP)

(73) Assignee: RENESAS ELECTRONICS CORPORATION, Kanagawa (JP)

(*) Notice: Subject to any disclaimer, the term of this patent is extended or adjusted under 35 U.S.C. 154(b) by 0 days.

(21) Appl. No.: 14/527,019

(22) Filed: Oct. 29, 2014

(65) Prior Publication Data

US 2015/0056762 A1 Feb. 26, 2015

Related U.S. Application Data

(63) Continuation of application No. 13/476,468, filed on May 21, 2012, now Pat. No. 8,901,553.

(30) Foreign Application Priority Data

May 25, 2011 (JP) .................. 2011-117374

(51) Int. Cl.
*H01L 21/336* (2006.01)
*H01L 29/12* (2006.01)
(Continued)

(52) U.S. Cl.
CPC ...... *H01L 29/66969* (2013.01); *H01L 21/0217* (2013.01); *H01L 21/02167* (2013.01);
(Continued)

(58) Field of Classification Search
CPC .......... H01L 29/12; H01L 29/78; H01L 29/24
See application file for complete search history.

(56) References Cited

U.S. PATENT DOCUMENTS 6,563,218 B2 * 5/2003 Matsunaga ......... H01L 23/5222
257/635
6,960,492 B1 11/2005 Miyamoto
(Continued)

FOREIGN PATENT DOCUMENTS

| CN | 101375406 A | 2/2009 |
|---|---|---|
| JP | 60103677 | 6/1985 |

(Continued)

OTHER PUBLICATIONS

Japanese Office Action, dated Dec. 9, 2014, in corresponding Japanese Patent Application No. 2011-117374.
(Continued)

*Primary Examiner* — Marc Armand
*Assistant Examiner* — Quinton Brasfield
(74) *Attorney, Agent, or Firm* — Young & Thompson

(57) ABSTRACT

The present invention makes it possible to lower the on resistance of a semiconductor element without hindering the function of a diffusion prevention film in a semiconductor device having the semiconductor element that uses a wire in a wiring layer as a gate electrode and has a gate insulation film in an identical layer to the diffusion prevention film. A first wire and a gate electrode are embedded into the surface layer of an insulation layer comprising a first wiring layer. A diffusion prevention film is formed between the first wiring layer and a second wiring layer. A gate insulation film is formed by: forming a recess over the upper face of the diffusion prevention film in the region overlapping with the gate electrode and around the region; and thinning the part.

11 Claims, 21 Drawing Sheets

(51) Int. Cl.
  *H01L 29/78* (2006.01)
  *H01L 29/66* (2006.01)
  *H01L 27/12* (2006.01)
  *H01L 23/522* (2006.01)
  *H01L 29/423* (2006.01)
  *H01L 23/532* (2006.01)
  *H01L 21/768* (2006.01)
  *H01L 29/786* (2006.01)
  *H01L 21/02* (2006.01)

(52) U.S. Cl.
  CPC .... *H01L21/02565* (2013.01); *H01L 21/76829* (2013.01); *H01L 21/76877* (2013.01); *H01L 23/522* (2013.01); *H01L 23/5329* (2013.01); *H01L 23/53295* (2013.01); *H01L 27/124* (2013.01); *H01L 27/1225* (2013.01); *H01L 29/42384* (2013.01); *H01L 29/7869* (2013.01); *H01L 29/78606* (2013.01); *H01L 2924/0002* (2013.01)

(56) References Cited

U.S. PATENT DOCUMENTS

| | | |
|---|---|---|
| 7,674,650 B2 | 3/2010 | Akimoto et al. |
| 8,378,341 B2 | 2/2013 | Hayashi et al. |
| 8,872,171 B2 | 10/2014 | Yamazaki et al. |
| 2008/0057698 A1* | 3/2008 | Ishigami ........... H01L 21/76805 438/618 |
| 2008/0070404 A1* | 3/2008 | Beck ................. H01L 21/76808 438/638 |
| 2008/0315204 A1 | 12/2008 | Okada |
| 2009/0294925 A1* | 12/2009 | Lin .................... H01L 21/3105 257/635 |
| 2009/0309186 A1* | 12/2009 | Inoue ................. H01L 23/5223 257/532 |
| 2010/0148171 A1* | 6/2010 | Hayashi ........... H01L 21/28282 257/43 |
| 2010/0207093 A1* | 8/2010 | Inoue ................ H01L 21/76807 257/4 |
| 2013/0134418 A1 | 5/2013 | Hayashi et al. |

FOREIGN PATENT DOCUMENTS

| | | |
|---|---|---|
| JP | 2001274409 | 10/2001 |
| JP | 2007-96055 | 4/2007 |
| JP | 2007123861 | 5/2007 |
| JP | 2009049340 A | 3/2009 |
| JP | 2009063603 | 3/2009 |
| JP | 2010141230 | 6/2010 |
| JP | 20100141230 | 6/2010 |
| JP | 2011009719 | 1/2011 |

OTHER PUBLICATIONS

Chinese Office Action dated Dec. 15, 2015; Application No. 201210166810.5.

* cited by examiner

SEMICONDUCTOR DEVICE MANUFACTURING METHOD

CROSS-REFERENCE TO RELATED APPLICATIONS

The disclosure of Japanese Patent Application No. 2011-117374 filed on May 25, 2011 including the specification, drawings and abstract is incorporated herein by reference in its entirety.

BACKGROUND

The present invention relates to a semiconductor device having a semiconductor element in a multilayer wiring layer and a manufacturing method of the semiconductor device.

As one of transistors, there is a transistor that uses a thin film of a compound semiconductor. In Patent Literatures 1 and 2 for example, a method of forming a thin film of a compound semiconductor over a substrate and forming a transistor by using the thin film is described.

In Patent Literature 3 further, a method of forming a semiconductor film in a wiring layer and forming a transistor by using the semiconductor film and a wire in the wiring layer is described. In the transistor, a wire located under a semiconductor film is used as a gate electrode and a diffusion prevention film between wiring layers is used as a gate insulation film.

PREVIOUS TECHNICAL LITERATURE

Patent Literature

[Patent Literature 1]
Japanese Unexamined patent Publication No. 2007-96055
[Patent Literature 2]
Japanese Unexamined patent Publication No. 2007-123861
[Patent Literature 3]
Japanese Unexamined patent Publication No. 2010-141230

SUMMARY

One of the characteristics required of a semiconductor element such as a transistor is the reduction of on resistance. The present inventors have found that there is the following problem in the technology described in Patent Literature 3. A diffusion prevention film requires a certain thickness in order to keep the diffusion prevention function. Consequently, if simply a diffusion prevention film is used as a gate insulation film, the thickness of the gate insulation film exceeds a certain level. On this occasion, the reduction of on resistance in a semiconductor device is limited.

The present invention makes it possible to provide a semiconductor device having a multilayer wiring layer including a first wiring layer and a second wiring layer located over the first wiring layer, a first wire embedded into the first wiring layer, a gate electrode embedded into the first wiring layer, a gate insulation film formed between the first wiring layer and the second wiring layer and located over the gate electrode, a diffusion prevention film formed between the first wiring layer and the second wiring layer and located over the first wire, a semiconductor film formed between the first wiring layer and the second wiring layer and located over the gate insulation film, and vias embedded into the second wiring layer and coupled to the semiconductor film, wherein the gate insulation film is thinner than the diffusion prevention film.

By the present invention, a gate insulation film is formed in an identical layer to a diffusion prevention film but is thinner than the diffusion prevention film. Consequently, it is possible to reduce the on resistance of a semiconductor element without hindering the function of the diffusion prevention film.

The present invention makes it possible to provide a semiconductor device having a multilayer wiring layer including a first wiring layer and a second wiring layer located over the first wiring layer, a first wire embedded into the first wiring layer, a gate electrode embedded into the first wiring layer, a gate insulation film formed between the first wiring layer and the second wiring layer and located over the gate electrode, a diffusion prevention film formed between the first wiring layer and the second wiring layer and located over the first wire, a semiconductor film formed between the first wiring layer and the second wiring layer and located over the gate insulation film, and vias embedded into the second wiring layer and coupled to the semiconductor device, wherein the gate insulation film has an insulation material layer including a different material from the diffusion prevention film.

By the present invention, a gate insulation film is formed in an identical layer to a diffusion prevention film but including a different material from the diffusion prevention film. Consequently, it is possible to reduce the on resistance of a semiconductor element without hindering the function of the diffusion prevention film.

The present invention makes it possible to provide a method for manufacturing a semiconductor device, including the steps of: forming a first interlayer insulation film; embedding a first wire and a gate electrode into the first interlayer insulation film; forming a diffusion prevention film over the first interlayer insulation film, over the first wire, and over the gate electrode; thinning the diffusion prevention film located over the gate electrode; forming a semiconductor film over the diffusion prevention film and over said gate electrode; forming a second interlayer insulation film over the diffusion prevention film and over the semiconductor film; and forming vias coupled to the semiconductor film in the second interlayer insulation film.

The present invention makes it possible to provide a method for manufacturing a semiconductor device, including the steps of: forming a first interlayer insulation film; embedding a first wire and a gate electrode into the first interlayer insulation film; forming a diffusion prevention film over the first interlayer insulation film, over the first wire, and over the gate electrode; removing the diffusion prevention film located over the gate electrode; forming an insulation material layer including a different insulation material from the diffusion prevention film over said gate electrode; forming a semiconductor film over the insulation material layer; forming a second interlayer insulation film over the diffusion prevention film and over the semiconductor film; and forming vias coupled to the semiconductor film in the second interlayer insulation film.

By the present invention, in a semiconductor device having a semiconductor element that uses a wire in a wiring layer as a gate electrode and has a gate insulation film in an identical layer to a diffusion prevention film, it is possible to reduce the on resistance of the semiconductor element without hindering the function of the diffusion prevention film.

DETAILED DESCRIPTION

The embodiments according to the present invention are hereunder explained in reference to drawings. Here, in all the drawings, an identical component is represented by an identical code and the explanations are appropriately omitted.

(First Embodiment)

Figure 1:
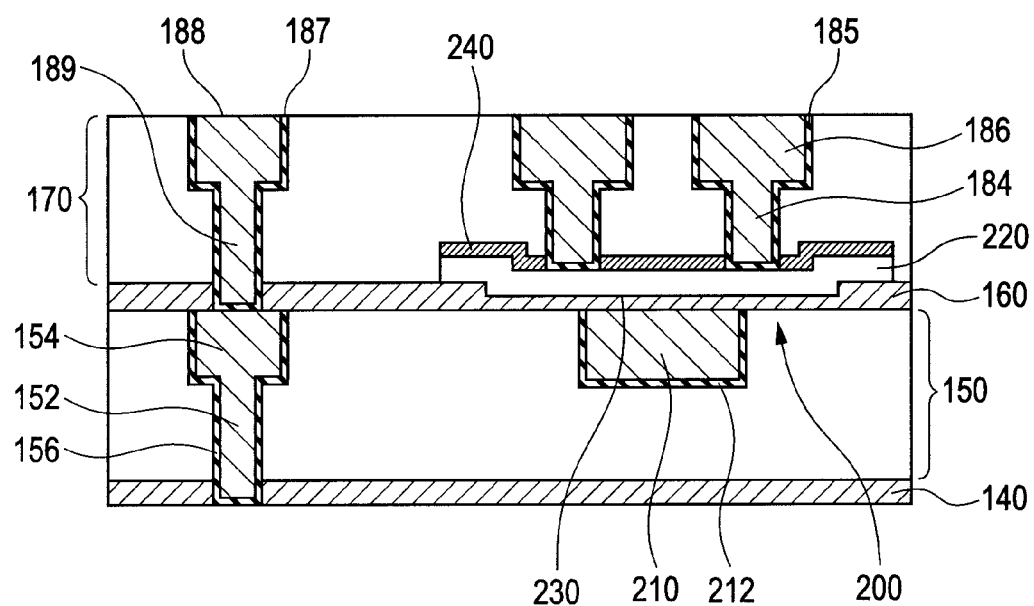
FIG. 1 is a sectional view showing the configuration of a semiconductor device according to First Embodiment.

FIG. 1 is a sectional view showing the configuration of a semiconductor device according to First Embodiment. The semiconductor device has a first wiring layer 150, a second wiring layer 170, a first wire 154, a gate electrode 210, a gate insulation film 230, a diffusion prevention film 160, a semiconductor film 220, and vias 184. The second wiring layer 170 is located over the first wiring layer 150. The first wiring layer 150 and the second wiring layer 170 configure at least a part of a multilayer wiring layer. The multilayer wiring layer is formed over a semiconductor substrate such as a silicon substrate (not shown in the figure). An element such as a transistor is formed over the semiconductor substrate. Such a semiconductor substrate and a transistor are described later in reference to another embodiment.

The insulation film including the first wiring layer 150 and the insulation film including the second wiring layer 170 are for example silicon oxide or a low permittivity insulation layer having a lower permittivity than silicon oxide (for example, the relative permittivity is 2.7 or less). The low permittivity insulation layer is for example a carbon-containing film such as an SiOC film, an SiOCH film, or an SiLK (registered trade mark), an HSQ (Hydrogen Silsesquioxane) film, an MHSQ (Methylated Hydrogen Silsesquioxane) film, an MSQ (Methyl Silsesquioxane) film, or a porous film thereof.

The first wiring layer 150 is formed over a diffusion prevention film 140. The diffusion prevention film 140 includes a similar material (it will be described later in detail) to the diffusion prevention film 160. The first wire 154 and the gate electrode 210 are embedded into the surface layer of the insulation layer including the first wiring layer 150. In the present embodiment, the first wire 154 and the gate electrode 210 are formed through an identical step. Consequently, the first wire 154 and the gate electrode 210 have an identical depth and include an identical material, for example a metallic material containing copper as the main component (95% or more).

The diffusion prevention film 160 is formed between the first wiring layer 150 and the second wiring layer 170. The diffusion prevention film 160 includes an insulation material containing at least two kinds of elements selected from the group of Si, C, and N. For example, the diffusion prevention film 160 is an SiN film, an SiCN film, or an SiC film. Here, the diffusion prevention film 160 may also be a laminated film formed by stacking at least two of those. The thickness of the diffusion prevention film 160 is 10 nm or more to 150 nm or less for example.

The gate insulation film 230 is formed in an identical layer to the diffusion prevention film 160. The gate insulation film 230 overlaps with the gate electrode 210 in a planar view. The gate insulation film 230 is thinner than the diffusion prevention film 160. In the present embodiment, the gate insulation film 230 is formed by: forming a recess on the upper face of the diffusion prevention film 160 in the region overlapping with the gate electrode 210 and around the circumference thereof; and thinning the part. The thickness of the gate insulation film 230 is 5 nm or more to 100 nm or less for example.

The semiconductor film 220 is formed over the gate insulation film 230 and the diffusion prevention film 160 located around the circumference. The thickness of the semiconductor film 220 is 10 nm or more to 300 nm or less for example. The semiconductor film 220 has an oxide semiconductor film such as an InGaZnO (IGZO) layer, an InZnO layer, a ZnO layer, a ZnAlO layer, a ZnCuO layer, an NiO layer, an SnO layer, or CuO, for example. The semiconductor film 220 may be either a single-layered structure of an oxide semiconductor film or a laminated structure of an above-stated oxide semiconductor film and another layer. An example of the latter case is a laminated film of $IGZO/Al_2O_3/IGZO/Al_2O_3$. Further, the semiconductor film 220 may be either a polysilicon layer or an amorphous silicon layer.

A source and a drain are formed in the semiconductor film 220. When the semiconductor film 220 is an oxide semiconductor film, the source and the drain are formed for example by introducing oxygen deficiencies but may also be formed by introducing impurities. When the semiconductor film 220 is a polysilicon layer or an amorphous silicon layer, the source and the drain are formed by introducing impurities. The width of the source and the drain is 50 nm or more to 500 nm or less for example.

The region interposed between the source and the drain in the semiconductor film 220 comes to be a channel region. In a planar view, the channel region overlaps with the gate electrode 210 and the gate insulation film 230. In a planar view further, the region where the recess is formed in order to form the gate insulation film 230 in the diffusion prevention film 160 overlaps with the region to come to the source and the drain in the semiconductor film 220 and the vias 184.

Over the semiconductor film 220 further, a hard mask film 240 (a second hard mask film) is formed. The hard mask film 240 is used when the semiconductor film 220 remains selectively at etching. Consequently, the planar shapes of the hard mask film 240 and the semiconductor film 220 are identical. The material of the hard mask film 240 may be any material as long as it is a material that has an etching selectivity to the semiconductor film 220. The hard mask film 240 has for example a layer including an identical material to the diffusion prevention film 160. The layer has for example an identical thickness to the diffusion prevention film 160. Otherwise the hard mask film 240 may be a laminated film formed by stacking a layer comprising an identical material to the diffusion prevention film 160 and another layer (for example, an $SiO_2$ layer or an SiOCH layer) over the layer in this sequence. On this occasion, the thickness of another layer is 10 nm or more to 200 nm or less for example.

A wire 188 and two wires 186 are formed in the second wiring layer 170. The wire 188 is coupled to the first wire 154 through a via 189 and the two wires 186 are coupled to the source/drain of the semiconductor film 220 through the vias 184 respectively. The wires 186 and the wire 188 are formed through an identical step. Consequently, the wires 186 and the wire 188 include an identical material, for example a metallic material containing copper as the main component (95% or more).

In the example shown in the figure, each of the wires and the vias has a dual damascene structure. Here, at least a wire and a via of one layer may have a single damascene structure. Then barrier metal films 156, 185, 187, and 212 are formed over the sidewalls of the grooves or the holes for embedding the wires and the vias. The barrier metal films 156, 185, 187, and 212 include Ti, Ta, Ru, W, nitride thereof, or oxide thereof for example. Here, the barrier metal films 156, 185, 187, and 212 may be either a single layer formed by such a material or a layer formed by stacking two or more layers. An example of a laminated structure is a laminated structure of TiN (upper layer)/Ti (lower layer) or Ta (upper layer)/TaN (lower layer).

Here, the combination of the material for each wire and the material for each barrier metal film is not limited to the above examples. For example, at least one wiring layer may include Al.

In the above configuration, the gate electrode 210, the gate insulation film 230, and the semiconductor film 220 configure a transistor 200 (second transistor). That is, in the present embodiment, an active element is formed in a multilayer wiring layer.

Figure 2:
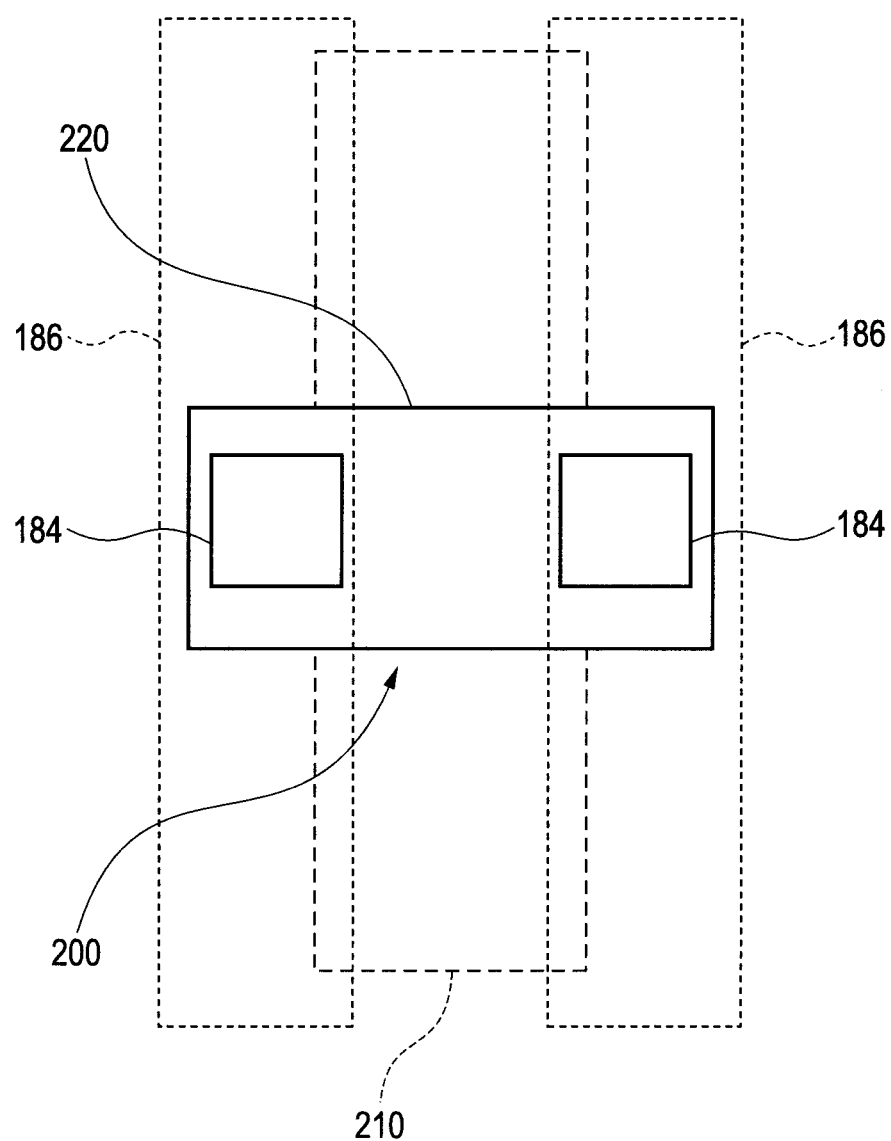
FIG. 2 is a plan view of the transistor 200 shown in FIG. 1.

FIG. 2 is a plan view of the transistor 200 shown in FIG. 1. In the example shown in the figure, the region of the semiconductor film 220 where one transistor 200 is formed has a rectangular shape. The two vias 184 are coupled to the vicinities of the two short sides of the semiconductor film 220.

Figure 3A:
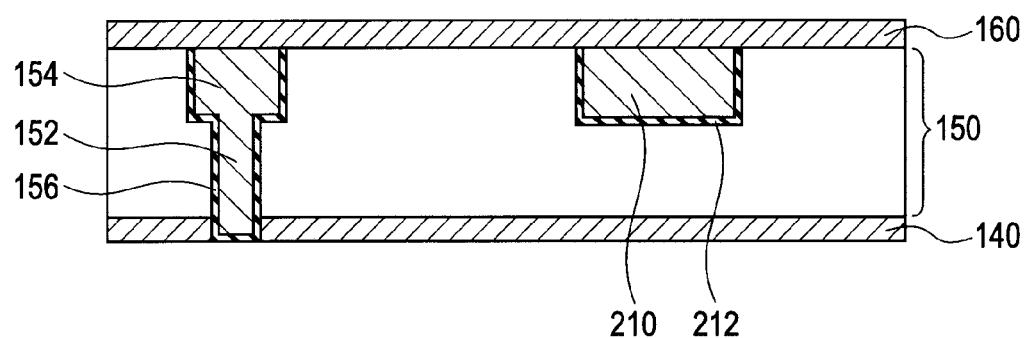
FIGS. 3A and 3B are sectional views showing the manufacturing method of the semiconductor device shown in FIG. 1.

FIGS. 3A, 3B, 4A, and 4B are sectional views showing the manufacturing method of the semiconductor device shown in FIG. 1. Firstly, as shown in FIG. 3A, a transistor, etc. are formed over a semiconductor substrate (not shown in the figures) and further a lower layer wiring layer (not shown in the figures) is formed over the semiconductor substrate. Successively, a diffusion prevention film 140 is formed over the wiring layer. Successively, an insulation film to act as a first wiring layer 150 is formed over the diffusion prevention film 140. Successively, a via hole and a wiring gutter are formed in the insulation film.

Successively, barrier metal films 156 and 212 are formed over the bottom faces and the sidewalls of the via hole and the wiring gutter and the insulation film to act as the first wiring layer 150. The barrier metal films 156 and 212 are formed by a sputtering method for example. Successively, a metal film is formed in the via hole and the wiring gutter and over the insulation film to act as the first wiring layer 150 by a plating method for example. Successively, the metal film and the barrier metal film over the insulation film to act as the first wiring layer 150 are removed by a CMP method for example. In this way, the first wiring layer 150 is formed. The first wiring layer 150 includes a first wire 154, a via 152, and a gate electrode 210.

Successively, a diffusion prevention film 160 is formed over the first wiring layer 150. The diffusion prevention film 160 is formed by a CVD method for example.

Figure 3B:
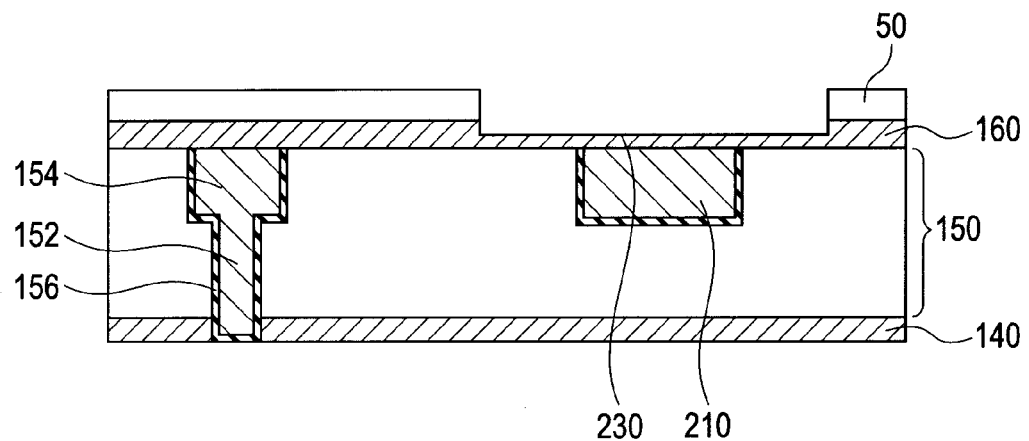

Successively, as shown in FIG. 3B, a resist pattern 50 is formed over the diffusion prevention film 160. The resist pattern 50 has an opening. The opening is located over the region where a gate insulation film 230 is formed. Successively, the diffusion prevention film 160 is etched by using the resist pattern 50 as a mask. In this way, a recess is formed in the diffusion prevention film 160. Then the bottom of the recess comes to be the gate insulation film 230.

Figure 4A:
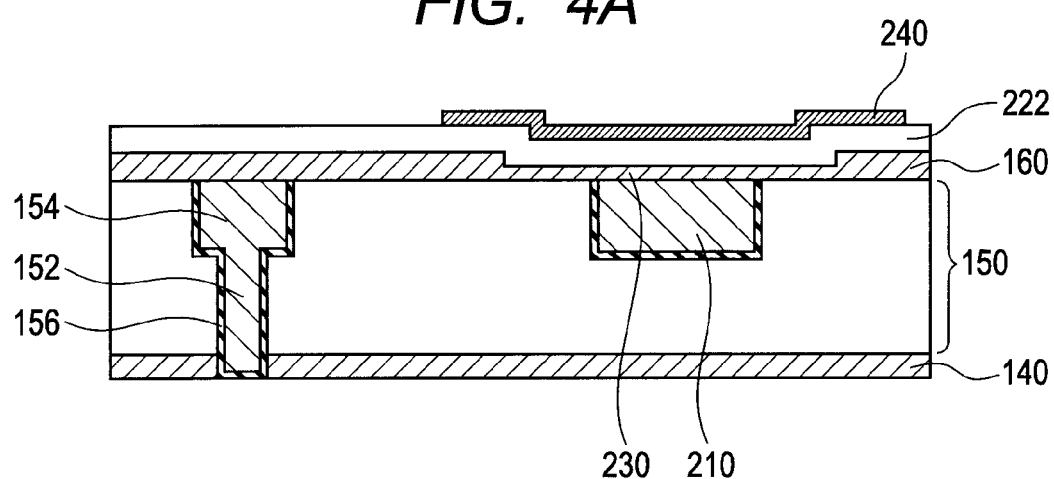
FIGS. 4A and 4B are sectional views showing the manufacturing method of the semiconductor device shown in FIG. 1.

Successively, as shown in FIG. 4A, the resist pattern 50 is removed. Successively, a semiconductor film 222 is formed over the whole face of the diffusion prevention film 160 including over the gate insulation film 230. When the semiconductor film 222 includes an oxide semiconductor film of InGaZnO, InZnO, ZnO, ZnAlO, ZnCuO, NiO, SnO, or CuO, the semiconductor film 222 is formed by a sputtering method for example. On this occasion, the semiconductor substrate 100 is heated to a temperature of 400° C. or lower. Meanwhile, when the semiconductor film 222 is a polysilicon layer or an amorphous silicon layer, the semiconductor film 222 is formed by a plasma CVD method for example.

Successively, an insulation layer to act as a hard mask film 240 is formed over the semiconductor film 222. When the hard mask film 240 has an identical layer to the diffusion prevention film 160 for example, the layer is formed by an identical method to the diffusion prevention film 160. When the hard mask film 240 further has a silicon oxide layer, the silicon oxide layer is formed by a CVD method for example. Successively, a resist pattern is formed over the insulation layer and the insulation layer is etched by using the resist pattern as a mask. In this way, the hard mask film 240 is formed. Successively, the resist pattern is removed if necessary.

Figure 4B:
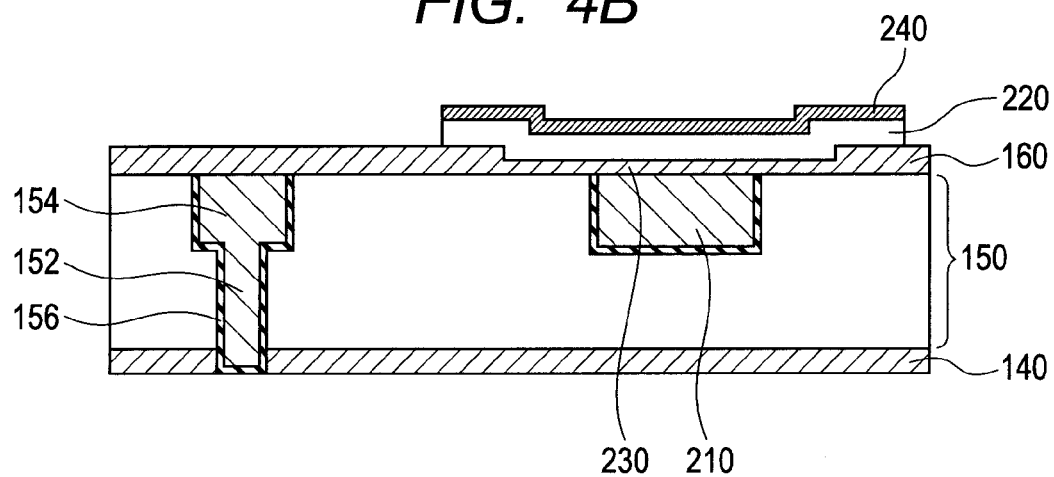

Successively, as shown in FIG. 4B, the semiconductor film 222 is etched by using the hard mask film 240 as a mask. In this way, a semiconductor film 220 is formed. The semiconductor film 220 is formed over the gate insulation film 230 and also over the diffusion prevention film 160 located around the gate insulation film 230. In this step, the semiconductor film 222 located over the first wire 154 is also removed.

Successively, a source and a drain are formed in the semiconductor film 220. Successively, an insulation film to act as a second wiring layer 170 is formed over the diffusion prevention film 160 and over the hard mask film 240. Successively, via holes and wiring gutters are formed in the insulation film. In the step of forming the via holes in the insulation film to act as the second wiring layer 170, the hard mask film 240 and the diffusion prevention film 160 function also as etching stoppers. When the hard mask film 240 has a film of an identical material and an identical thickness to the diffusion prevention film 160 in particular, conditions in a step of piercing the hard mask film 240 and the diffusion prevention film 160 located at the bottoms of the vias can be determined easily.

Successively, treatment by reducing plasma (for example, hydrogen plasma) or treatment by nitrogen-containing plasma (for example, ammonia plasma) is applied to the region of the semiconductor film 220 where the semiconductor film 220 is exposed on the bottom faces of the via holes. In this way, the source and the drain are formed in the semiconductor film 220.

Successively, barrier metal films 185 and 187 are formed over the bottom faces and the sidewalls of the via holes and the wiring gutters and the insulation film to act as the second wiring layer 170. The barrier metal films 185 and 187 are formed by a sputtering method for example. Successively, a metal film is formed in the via holes and the wiring gutters and over the insulation film to act as the second wiring layer 170 by a plating method for example. Successively, the metal film and the barrier metal film over the insulation film to act as the first wiring layer 150 are removed by a CMP method for example. In this way, the second wiring layer 170 is formed. The second wiring layer 170 includes wires 186 and 188 and vias 184 and 189. In this way, the semiconductor device shown in FIG. 1 is formed.

The functions and effects of the present embodiment are explained hereunder. In the present embodiment, a gate insulation film 230 of a transistor 200 is thinner than a diffusion prevention film 160. Consequently, it is possible to lower the on resistance of the transistor 200 while the diffusion prevention function of the diffusion prevention film 160 is maintained. In the present embodiment in particular, the gate insulation film 230 is formed by thinning the diffusion prevention film 160. Consequently, the number of additional step for forming the gate insulation film 230 can be reduced.

(Second Embodiment)

Figure 5:
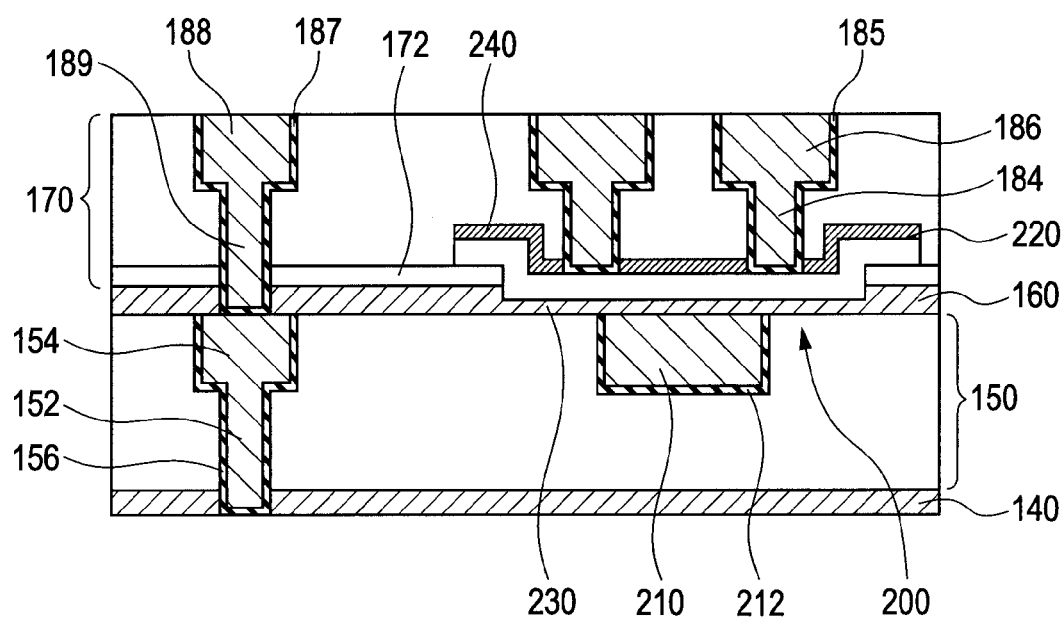
FIG. 5 is a sectional view showing the configuration of a semiconductor device according to Second Embodiment.

FIG. 5 is a sectional view showing the configuration of a semiconductor device according to Second Embodiment and corresponds to FIG. 1 in First embodiment. The semiconductor device has a similar configuration to a semiconductor device according to First Embodiment except that it has a hard mask film 172 (first hard mask film).

In the present embodiment, a hard mask film 172 is located between a second wiring layer 170 and a diffusion prevention film 160. In a planar view, the hard mask film 172 covers the part other than a gate insulation film 230 of the diffusion prevention film 160. That is, the hard mask film 172 functions as a hard mask when a recess is formed in the diffusion prevention film 160 and the gate insulation film 230 is formed. The hard mask film 172 includes a material similar to the material including the second wiring layer 170 and is an SiO$_2$ film or an SiOCH film for example. The thickness of the hard mask film 172 is 10 nm or more to 100 nm or less for example.

Figure 6A:
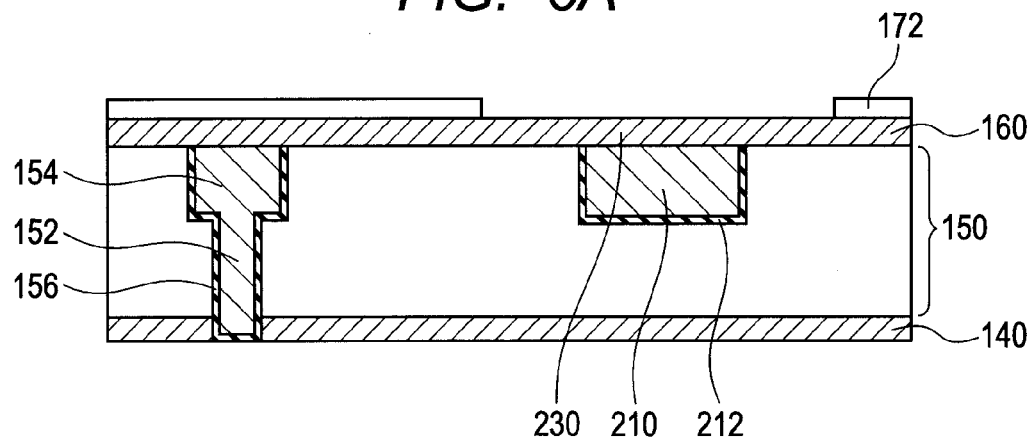
FIGS. 6A and 6B are sectional views showing the manufacturing method of the semiconductor device shown in FIG. 5.
Figure 6B:
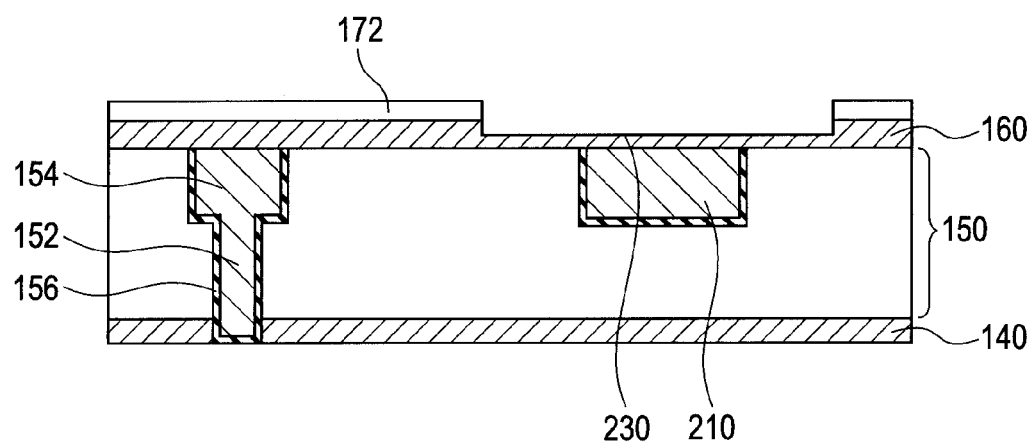
Figure 7:
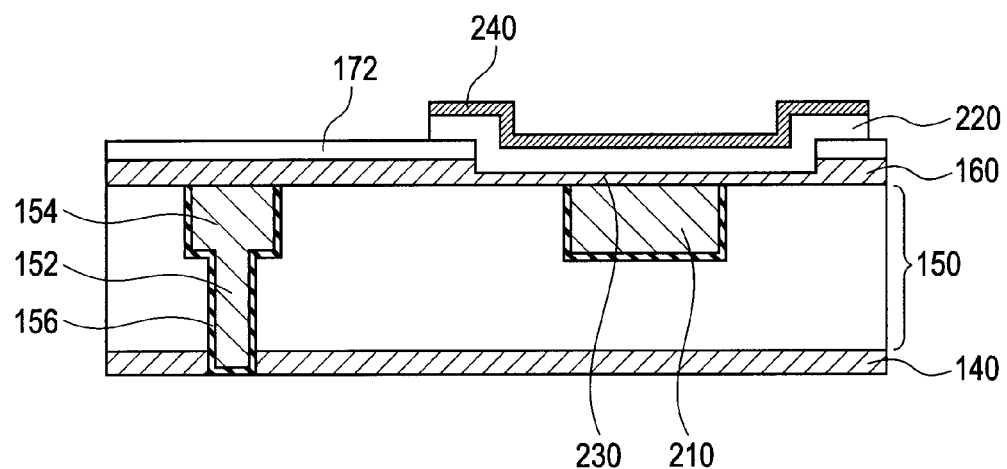
FIG. 7 is a sectional view showing the manufacturing method of the semiconductor device shown in FIG. 5.

FIGS. 6A, 6B, and 7 are sectional views showing the manufacturing method of the semiconductor device shown in FIG. 5. Firstly, as shown in FIG. 6A, a diffusion prevention film 140, a first wiring layer 150, and a diffusion prevention film 160 are formed. The methods for forming those layer and films are similar to First Embodiment. Successively, an insulation film to act as a hard mask film 172 is formed over the diffusion prevention film 160 by a CVD method for example. Successively, a resist pattern (not shown in the figures) is formed over the insulation film and the insulation film is etched by using the resist pattern as a mask. In this way, the hard mask film 172 is formed. The hard mask film 172 has an opening. The opening is located over the region where a gate insulation film 230 is formed.

Successively, as shown in FIG. 6B, the diffusion prevention film 160 is etched by using the hard mask film 172 as a mask. In this way, a recess is formed in the diffusion prevention film 160. Then the bottom of the recess comes to be the gate insulation film 230.

Successively as shown in FIG. 7, a semiconductor film 222 and a hard mask film 240 shown in FIG. 4A are formed over the gate insulation film 230 and over the hard mask film 172. Successively, the semiconductor film 222 is etched by using the hard mask film 240 as a mask. In this way, a semiconductor film 220 is formed. The semiconductor film 220 is formed over the gate insulation film 230 and also over the hard mask film 172 located around the gate insulation film 230.

Succeeding steps are similar to First Embodiment.

Also in the present embodiment, similar effects to First Embodiment can be obtained. Further, a hard mask film 172 is used as a mask when a semiconductor film 220 is formed. Consequently, it is possible to pattern the semiconductor film 220 into a desired shape without fail.

Meanwhile, the hard mask film 172 includes a similar material to an insulation film including a second wiring layer 170. Consequently, even when the hard mask film 172 is not removed, the hard mask film 172 can be regarded as a part of the second wiring layer 170 and hence it is possible to inhibit the hard mask film 172 from influencing the characteristics (for example, a parasitic capacity between wires) of a semiconductor device.

(Third Embodiment)

Figure 8:
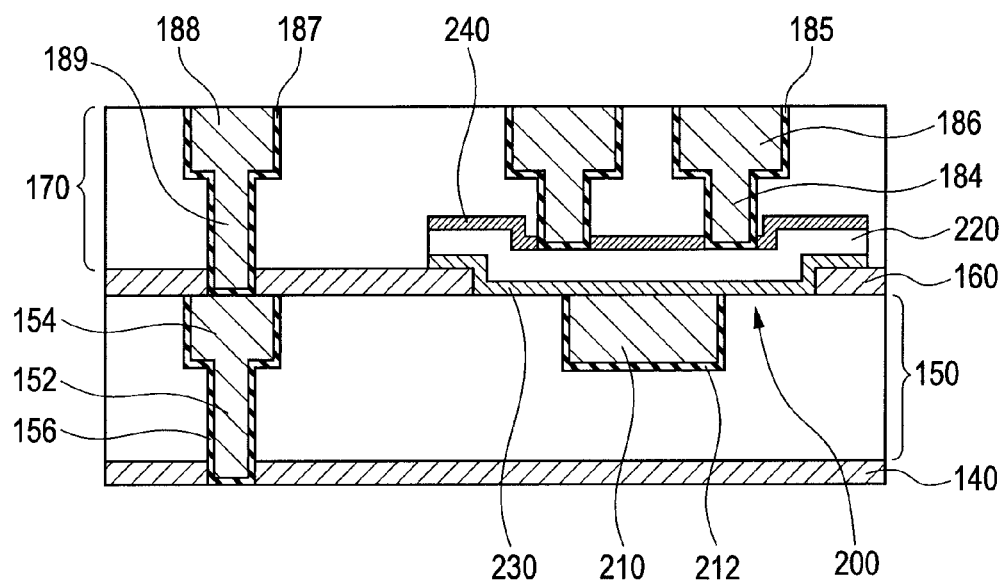
FIG. 8 is a sectional view showing the configuration of a semiconductor device according to Third Embodiment.

FIG. 8 is a sectional view showing the configuration of a semiconductor device according to Third Embodiment and corresponds to FIG. 1 in First Embodiment. The semiconductor device according to the present embodiment has a similar configuration to a semiconductor device according to First Embodiment except the configuration of a gate insulation film 230.

In the present embodiment, a gate insulation film 230 includes a different material from a diffusion prevention film 160 as a film different from the diffusion prevention film 160. That is, the whole layer of the diffusion prevention film 160 is removed from over a gate electrode 210 and an insulation material layer is formed as the gate insulation film 230 instead. The material for the gate insulation film 230 has a higher permittivity than the material for the diffusion prevention film 160. The gate insulation film 230 includes for example an SiN layer, a composite metallic oxide layer having a perovskite structure, or a layer of oxide of one or more kinds of metals selected from the group consisting of Si, Al, Hf, Zr, Ta, and Ti. Further, the gate insulation film 230 is thinner than the diffusion prevention film 160. The thickness of the gate insulation film 230 is 5 nm or more to 100 nm or less for example.

The gate insulation film 230 has an identical shape to a semiconductor film 220 in a planar view. That is, the planar shape of the gate insulation film 230 is formed through an identical step to the semiconductor film 220. More specifically, an opening is formed in the diffusion prevention film

160. The opening is located over and around the gate electrode 210. The gate insulation film 230 and the semiconductor film 220 are formed in the opening formed in the diffusion prevention film 160 and over the diffusion prevention film 160 located around the opening. Then a hard mask film 240 is formed over the semiconductor film 220.

Figure 9A:
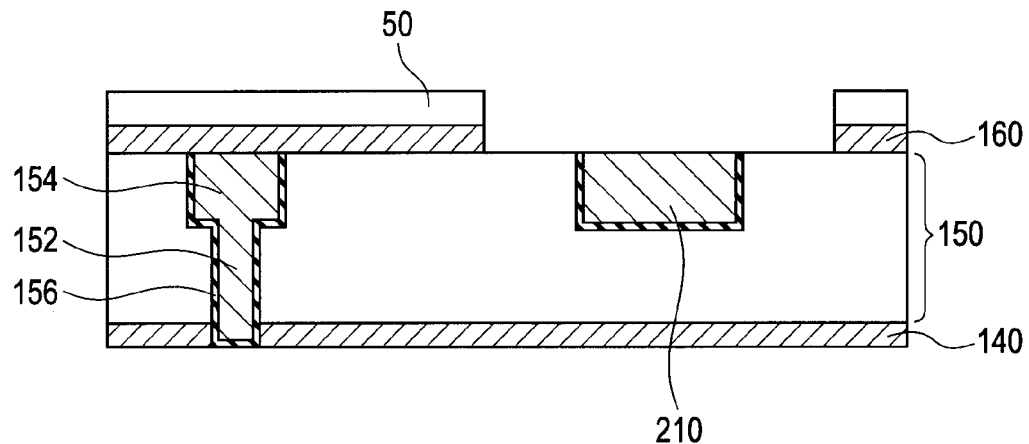
FIGS. 9A and 9B are sectional views showing the manufacturing method of the semiconductor device shown in FIG. 8.
Figure 9B:
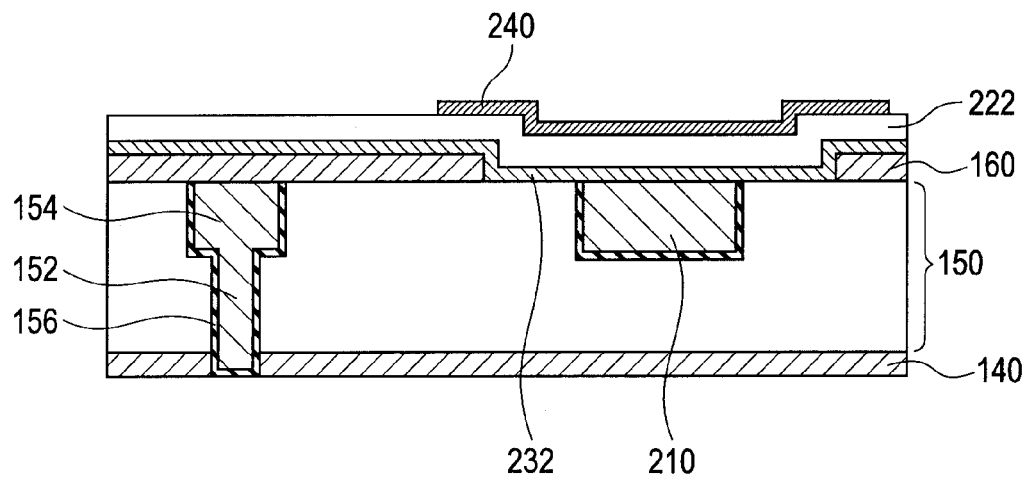
Figure 10:
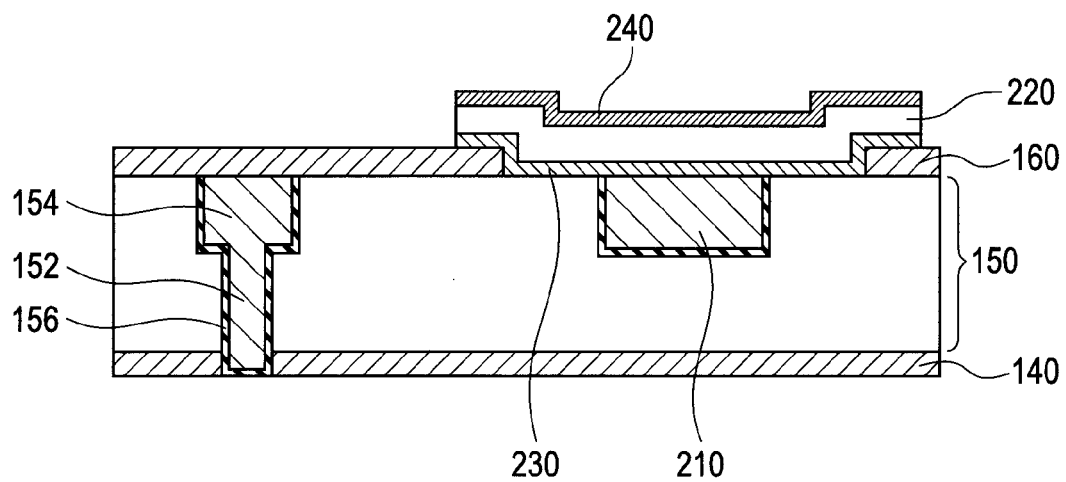
FIG. 10 is a sectional view showing the manufacturing method of the semiconductor device shown in FIG. 8.

FIGS. 9A, 9B, and 10 are sectional views showing the manufacturing method of the semiconductor device shown in FIG. 8. Firstly, as shown in FIG. 9A, a diffusion prevention film 140, a first wiring layer 150, a diffusion prevention film 160, and a resist pattern 50 are formed. The methods for forming those films and layer are similar to First Embodiment. Successively, the diffusion prevention film 160 is etched by using the resist pattern 50 as a mask. In this way, an opening is formed in the diffusion prevention film 160.

Successively, as shown in FIG. 9B, the resist pattern 50 is removed. Successively, an insulation material layer 232 and a semiconductor film 222 are formed in this sequence in the opening including over the gate electrode 210 and over the whole face of the diffusion prevention film 160. Successively, a hard mask film 240 is formed over the semiconductor film 222.

Successively, as shown in FIG. 10, the semiconductor film 222 and the insulation material layer 232 are etched by using the hard mask film 240 as a mask. In this way, a semiconductor film 220 and a gate insulation film 230 are formed.

Succeeding steps are similar to First Embodiment.

Also in the present embodiment, it is possible to obtain similar effects to First Embodiment. Further, since a gate insulation film 230 includes a different material from a diffusion prevention film 160, it is possible to expand the allowance to adjust the permittivity of the gate insulation film 230.

(Fourth Embodiment)

Figure 11:
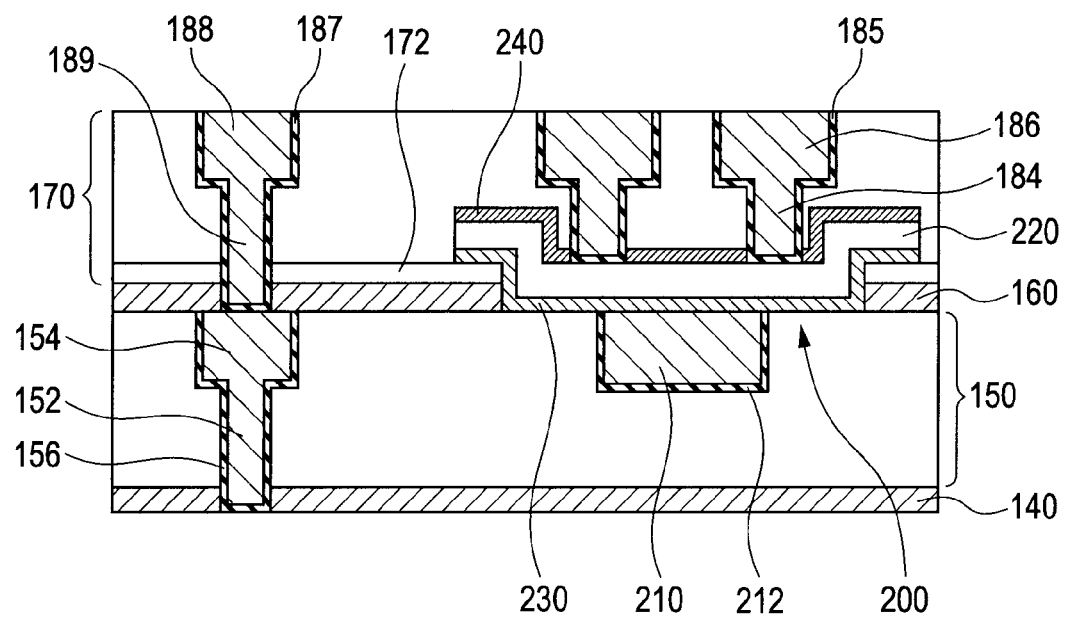
FIG. 11 is a sectional view showing the configuration of a semiconductor device according to Fourth Embodiment.

FIG. 11 is a sectional view showing the configuration of a semiconductor device according to Fourth Embodiment and corresponds to FIG. 8 in Third Embodiment. The semiconductor device is similar to a semiconductor device according to Third Embodiment except that it has a hard mask film 172. The hard mask film 172, as it has been explained in Second Embodiment, is located between a diffusion prevention film 160 and a second wiring layer 170 and functions as a hard mask when an opening for embedding a gate insulation film 230 into the diffusion prevention film 160 is formed. Here, the gate insulation film 230, a semiconductor film 220, and a hard mask film 240 are also formed over the part of the hard mask film 172 located around the opening.

Figure 12A:
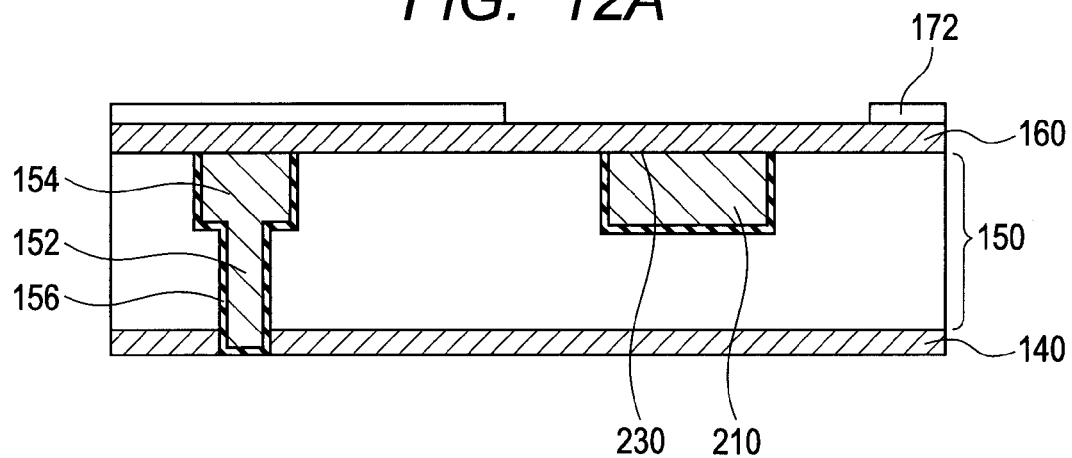
FIGS. 12A and 12B are sectional views showing the manufacturing method of the semiconductor device shown in FIG. 11.
Figure 12B:
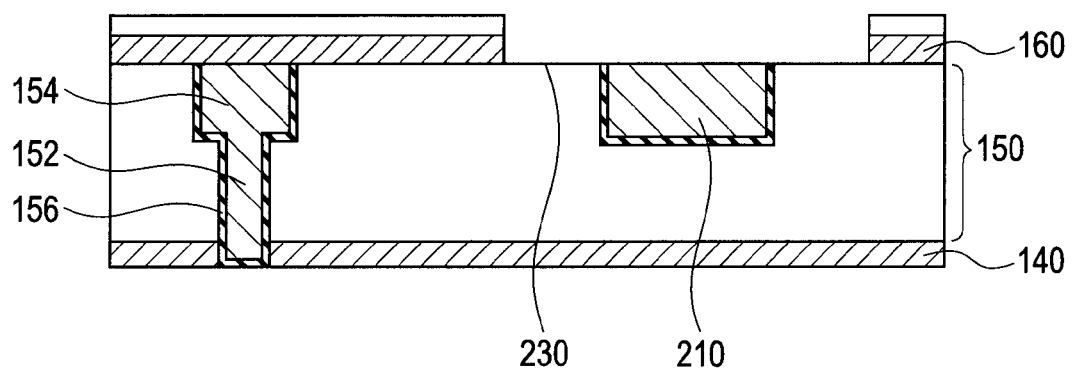
Figure 13:
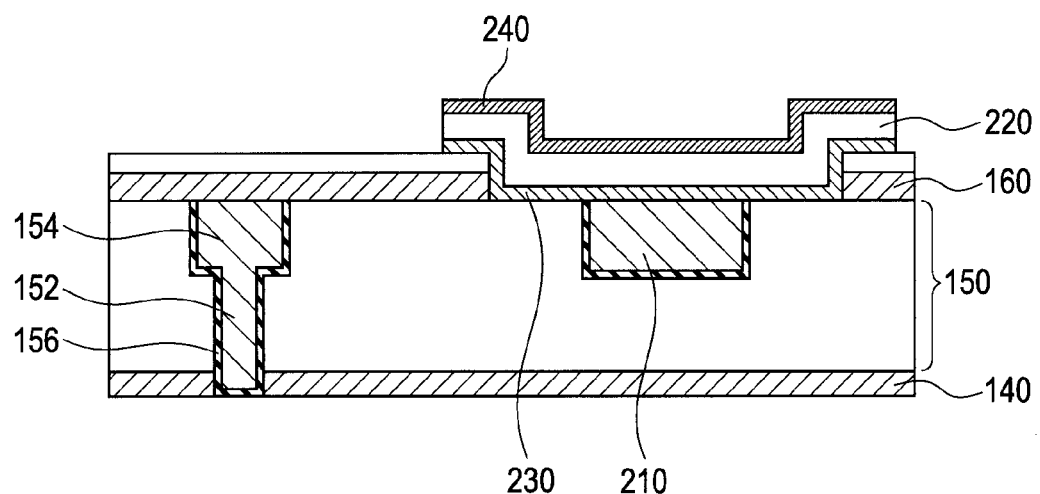
FIG. 13 is a sectional view showing the manufacturing method of the semiconductor device shown in FIG. 11.

FIGS. 12A, 12B, and 13 are sectional views showing the manufacturing method of the semiconductor device shown in FIG. 11. Firstly, as shown in FIG. 12A, a diffusion prevention film 140, a first wiring layer 150, and a diffusion prevention film 160 are formed. The methods for forming those films and layer are similar to Third Embodiment. Successively, an insulation film to act as a hard mask film 172 is formed over the diffusion prevention film 160 by a CVD method for example. Successively, a resist pattern (not shown in the figure) is formed over the insulation film and the insulation film is etched by using the resist pattern as a mask. In this way, the hard mask film 172 is formed. The hard mask film 172 has an opening.

Successively, as shown in FIG. 12B, the diffusion prevention film 160 is etched by using the hard mask film 172 as a mask. In this way, an opening is formed in the diffusion prevention film 160. The opening is located over a gate electrode 210.

Successively, as shown in FIG. 13, an insulation material layer 232, a semiconductor film 222, and a hard mask film 240 shown in FIG. 9B are formed over the opening including the gate electrode 210 and over the hard mask film 172. Successively, the semiconductor film 222 and the insulation material layer 232 are etched by using the hard mask film 240 as a mask. In this way, a semiconductor film 220 and a gate insulation film 230 are formed.

Succeeding steps are similar to Third Embodiment.

Also in the present embodiment, it is possible to obtain similar effects to Third Embodiment. Further, a hard mask film 172 is used as a mask when a gate insulation film 230 and a semiconductor film 220 are formed. Consequently, it is possible to pattern the gate insulation film 230 and the semiconductor film 220 into a desired shape without fail.

(Fifth Embodiment)

Figure 14:
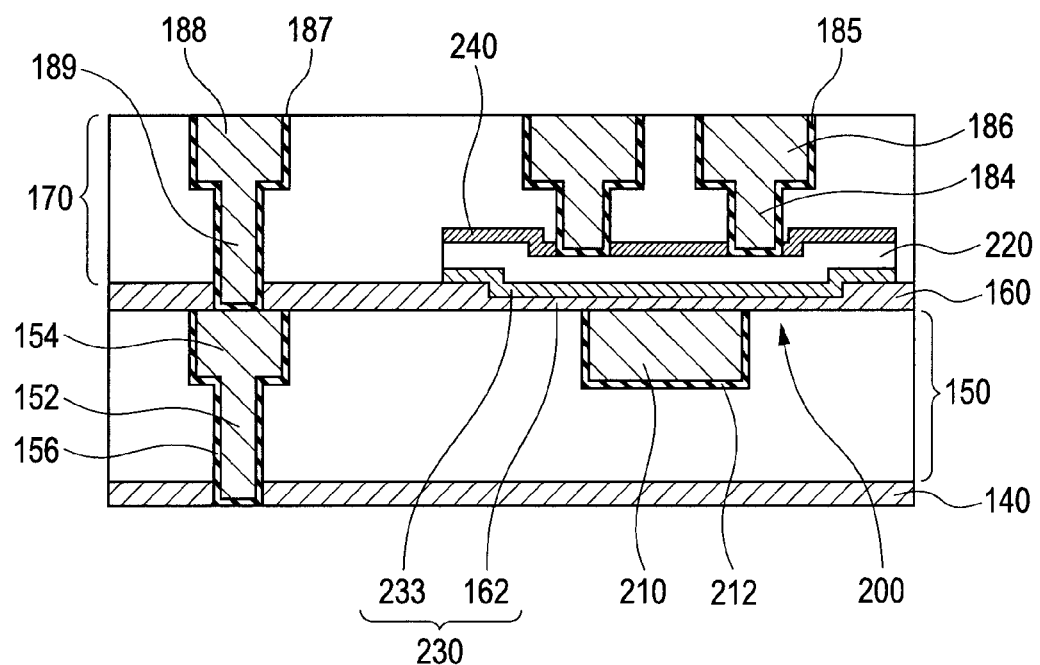
FIG. 14 is a sectional view showing the configuration of a semiconductor device according to Fifth Embodiment.

FIG. 14 is a sectional view showing the configuration of a semiconductor device according to Fifth Embodiment. The semiconductor device has a similar configuration to a semiconductor device according to First Embodiment except that a gate insulation film 230 has a laminated structure of a diffusion prevention film 162 and an insulation material film 233.

The diffusion prevention film 162 is formed by thinning a part of a diffusion prevention film 160 located over a gate electrode 210. Then the insulation material film 233 includes a similar material to the gate insulation film 230 in Third Embodiment and the periphery thereof is located over the diffusion prevention film 160 located around the diffusion prevention film 162. Further, a semiconductor film 220 and a hard mask film 240 have an identical shape to the insulation material film 233 in a planar view.

Figure 15A:
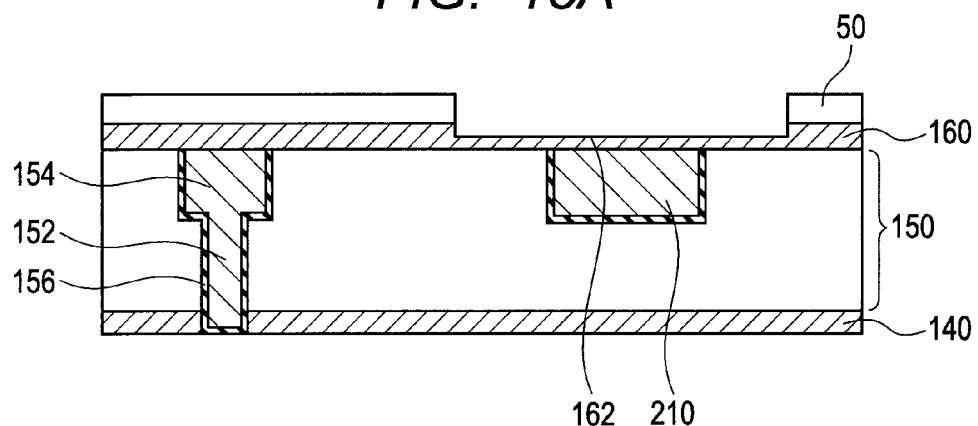
FIGS. 15A and 15B are sectional views showing the manufacturing method of the semiconductor device shown in FIG. 14.
Figure 15B:
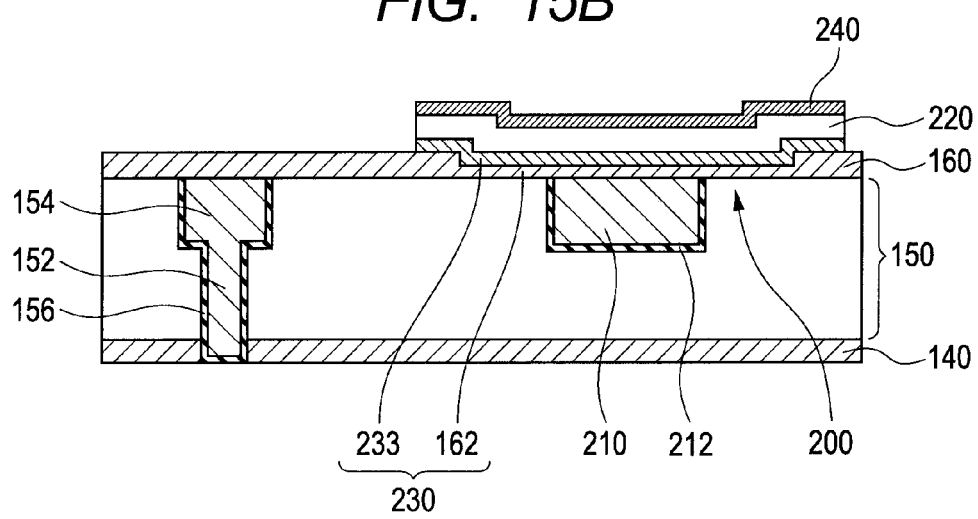

FIGS. 15A and 15B are sectional views showing the manufacturing method of the semiconductor device shown in FIG. 14. Firstly, as shown in FIG. 15A, a diffusion prevention film 140, a first wiring layer 150, and a diffusion prevention film 160 are formed. The methods for forming the diffusion prevention film 140, the first wiring layer 150, and the diffusion prevention film 160 are similar to First Embodiment. Successively, a resist pattern 50 is formed over the diffusion prevention film 160 and the diffusion prevention film 160 is etched by using the resist pattern 50 as a mask. In this way, a diffusion prevention film 162 is formed.

Successively, as shown in FIG. 15B, the resist pattern 50 is removed. An insulation material layer and a semiconductor film are formed in this sequence over the whole face of the diffusion prevention film 160 including over the diffusion prevention film 162. Successively, a hard mask film 240 is formed over the semiconductor film. Successively, the semiconductor film and the insulation material layer are etched by using the hard mask film 240 as a mask. In this way, a semiconductor film 220 and an insulation material film 233 are formed.

Succeeding steps are similar to First Embodiment.

Also in the present embodiment, it is possible to obtain similar effects to First Embodiment. Further, since a gate insulation film 230 is formed in the laminated structure of a diffusion prevention film 162 and an insulation material film 233, it is possible to expand the allowance to adjust the permittivity of the gate insulation film 230 while the gate insulation film 230 maintains the diffusion prevention function.

(Sixth Embodiment)

Figure 16:
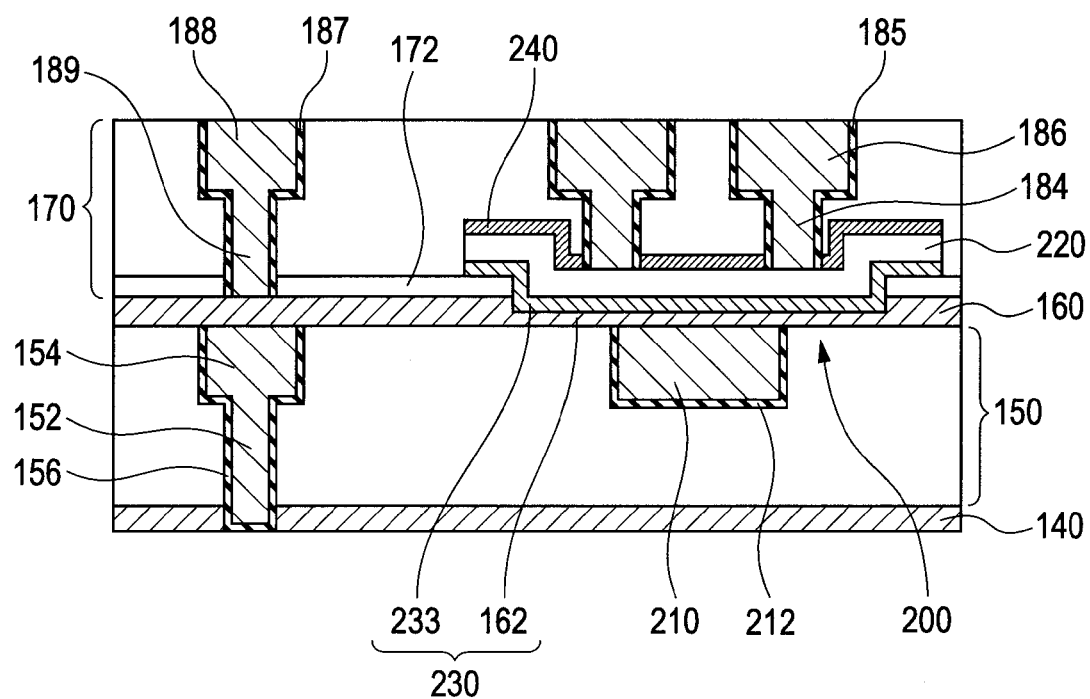
FIG. 16 is a sectional view showing the configuration of a semiconductor device according to Sixth Embodiment.

FIG. 16 is a sectional view showing the configuration of a semiconductor device according to Sixth Embodiment. The semiconductor device has a similar configuration to a semiconductor device according to Fifth Embodiment except that it has a hard mask film 172. In the present embodiment, the periphery of an insulation material film 233 is located over the hard mask film 172.

Figure 17A:
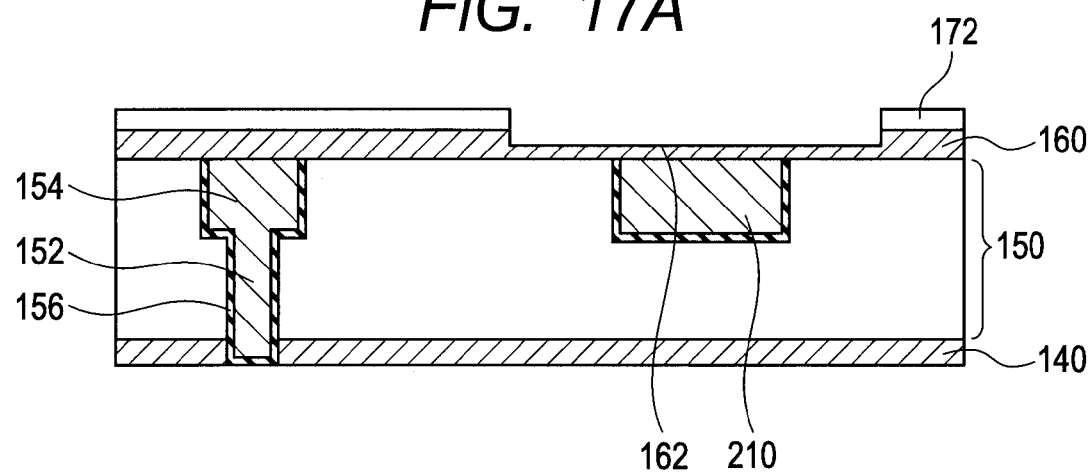
FIGS. 17A and 17B are sectional views showing the manufacturing method of the semiconductor device shown in FIG. 16.
Figure 17B:
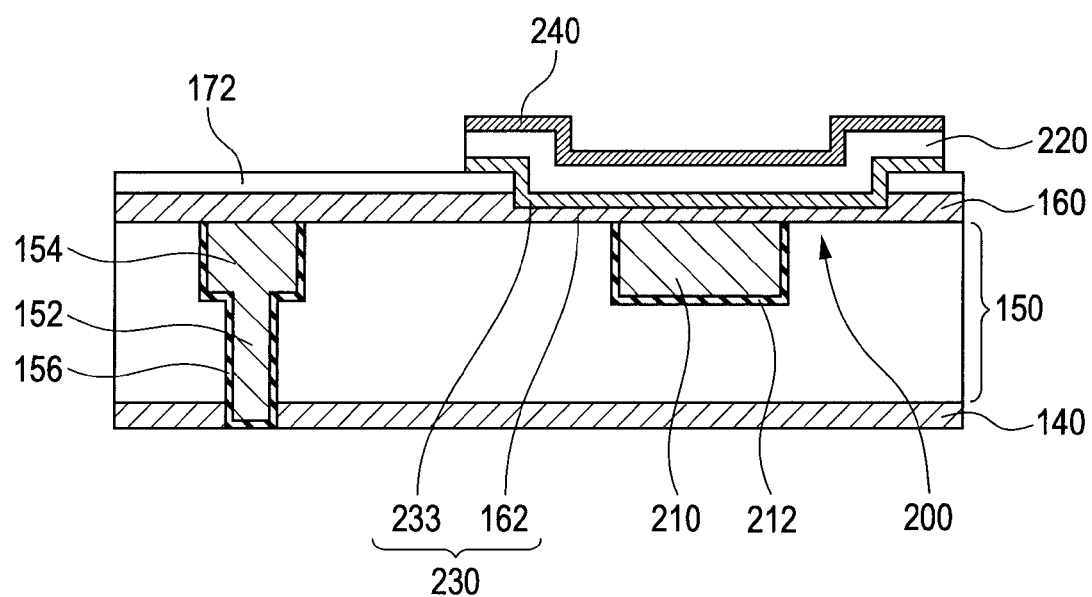

FIGS. 17A and 17B are sectional views showing the manufacturing method of the semiconductor device shown in FIG. 16. With regard to the manufacturing method shown in the figures, the manufacturing method is similar to the manufacturing method of a semiconductor device according to Fifth Embodiment except that a hard mask film 172 is used instead of a resist pattern 50. Specifically, as shown in FIG. 17A, a diffusion prevention film 140, a first wiring layer 150, and a diffusion prevention film 160 are formed. Successively, a hard mask film 172 is formed over the diffusion prevention film 160 and the diffusion prevention film 160 is etched by using the hard mask film 172 as a mask. In this way, a diffusion prevention film 162 is formed.

Successively, an insulation material layer and a semiconductor film are formed in this sequence over the hard mask film 172 and over the diffusion prevention film 162. Successively, a hard mask film 240 is formed over the semiconductor film. Successively, the semiconductor film and the insulation material layer are etched by using the hard mask film 240 as a mask. In this way, a semiconductor film 220 and an insulation material film 233 are formed.

Succeeding steps are similar to Fifth Embodiment.

Also in the present embodiment, it is possible to obtain similar effects to Fifth Embodiment. Further, a hard mask film 172 is used as a mask when a gate insulation film 230 and a semiconductor film 220 are formed. Consequently, it is possible to pattern the gate insulation film 230 and the semiconductor film 220 into a desired shape without fail.

(Seventh Embodiment)

Figure 18:
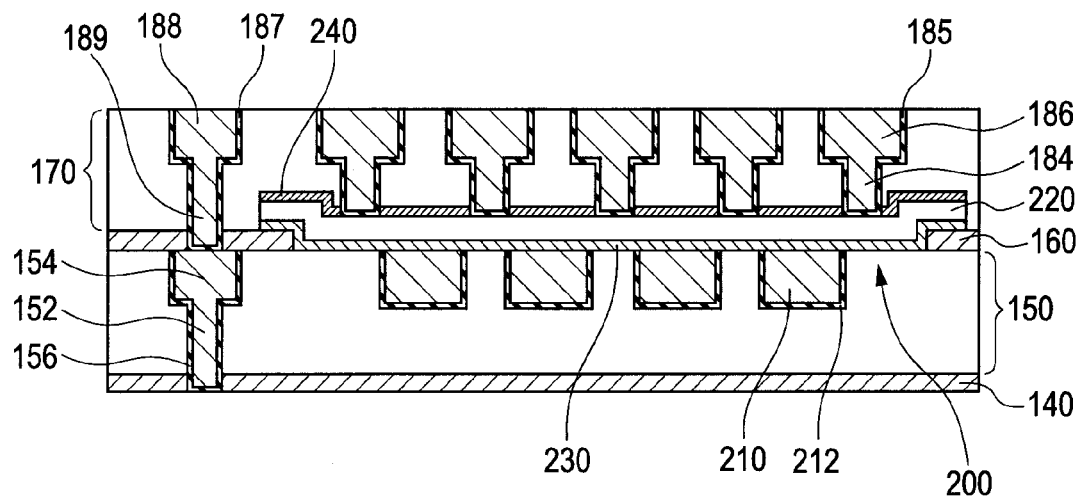
FIG. 18 is a sectional view showing the configuration of a semiconductor device according to Seventh Embodiment.
Figure 19:
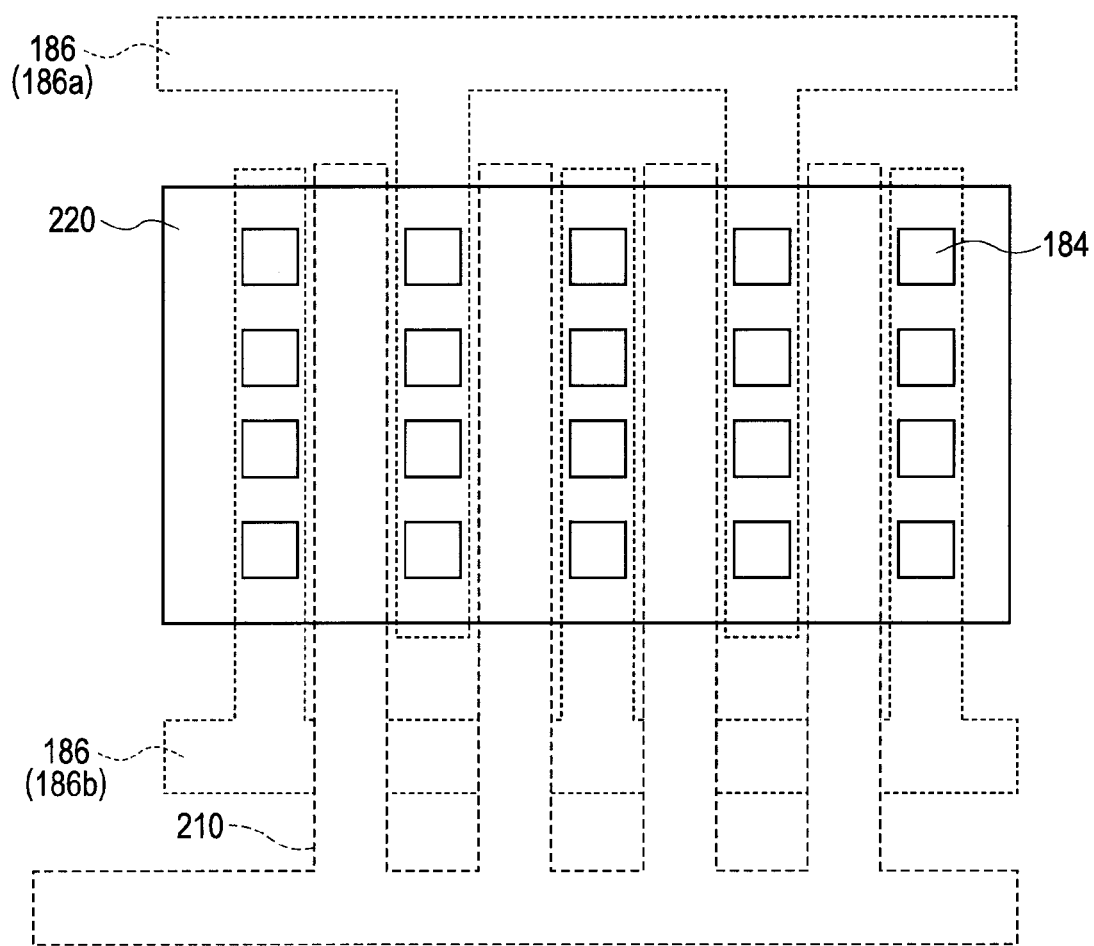
FIG. 19 is a plan view of the semiconductor device shown in FIG. 18.

FIG. 18 is a sectional view showing the configuration of a semiconductor device according to Seventh Embodiment. FIG. 19 is a plan view of the semiconductor device shown in FIG. 18. In the semiconductor device, the laminated structure of the layers includes a transistor 200 is similar to First Embodiment. The planar layout of a gate electrode 210 however has a pectinate shape. Then a wire 186 (186b) to act as a source wire and a wire 186 (186a) to act as a drain wire extend alternately over parts of a semiconductor film 220 interposed between teeth of the pectinare gate electrode 210. Then a plurality of vias 184 are formed for each of the wires 186. Each of the planar layouts of the two wires 186 also has a pectinate shape. That is, the transistor 200 according to the present embodiment has a pectinate layout.

In the present embodiment too, it is possible to obtain similar effects to Fifth Embodiment. Further, since a transistor 200 has a pectinate layout and an effective channel width can be widened, it is possible to increase the on current of the transistor 200.

In the present embodiment here, the laminated structure of the layers including a transistor 200 may be any of the structures shown in Second to Sixth Embodiments.

(Eighth Embodiment)

Figure 20:
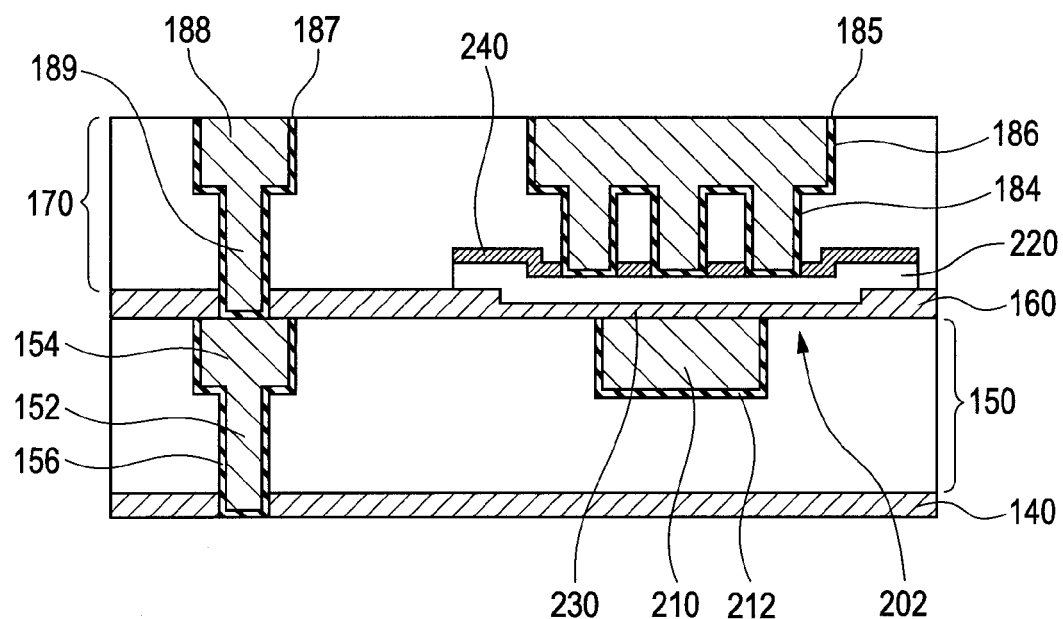
FIG. 20 is a sectional view showing the configuration of a semiconductor device according to Eighth Embodiment.

FIG. 20 is a sectional view showing the configuration of a semiconductor device according to Eighth Embodiment. The semiconductor device has a similar configuration to a semiconductor device according to First Embodiment except that it has a capacitive element 202 instead of a transistor 200.

The capacitive element 202 is a capacitive element of an MIS type and is configured so that vias 184 coupled to a source, a channel region, and a drain in a transistor 200 respectively may be coupled to an identical wire 186. Consequently, the capacitive element 202 can be formed by an identical method to a transistor 200.

In the present embodiment, it is possible to form an MIS type capacitive element 202 in a multilayer wiring layer. Thus it is possible to form a transistor 200 shown in First Embodiment and a capacitive element 202 according to the present embodiment in an identical layer through an identical step.

In the present embodiment here, the laminated structure of the layers including a capacitive element 202 may be any of the structures shown in Second to Sixth Embodiments.

(Ninth Embodiment)

Figure 21:
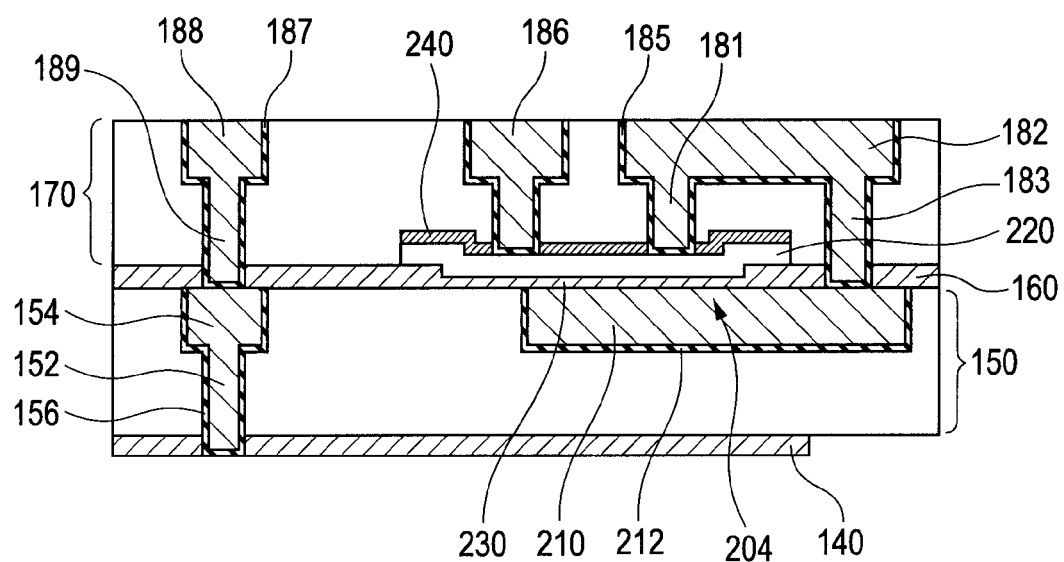
FIG. 21 is a sectional view showing the configuration of a semiconductor device according to Ninth Embodiment.

FIG. 21 is a sectional view showing the configuration of a semiconductor device according to Ninth Embodiment. The semiconductor device has a similar configuration to a semiconductor device according to First Embodiment except that it has a diode 204 instead of a transistor 200.

A diode 204 is configured so that a gate electrode 210 of a transistor 200 in First Embodiment and a wire 182 coupled to a source of a semiconductor film 220 may short-circuit through a via 183. The via 183 is formed through an identical step to a via 181. That is, the vias 181 and 183 and the wire 182 have a dual damascene structure.

In the present embodiment, it is possible to form a diode 204 in a multilayer wiring layer. Then it is possible to form at least either a transistor 200 shown in First Embodiment or a capacitive element 202 shown in Eighth Embodiment and a diode 204 according to the present embodiment in an identical layer through an identical step.

In the present embodiment here, the laminated structure of the layers including a diode 204 may be any of the structures shown in Second to Sixth Embodiments.

(Tenth Embodiment)

Figure 22:
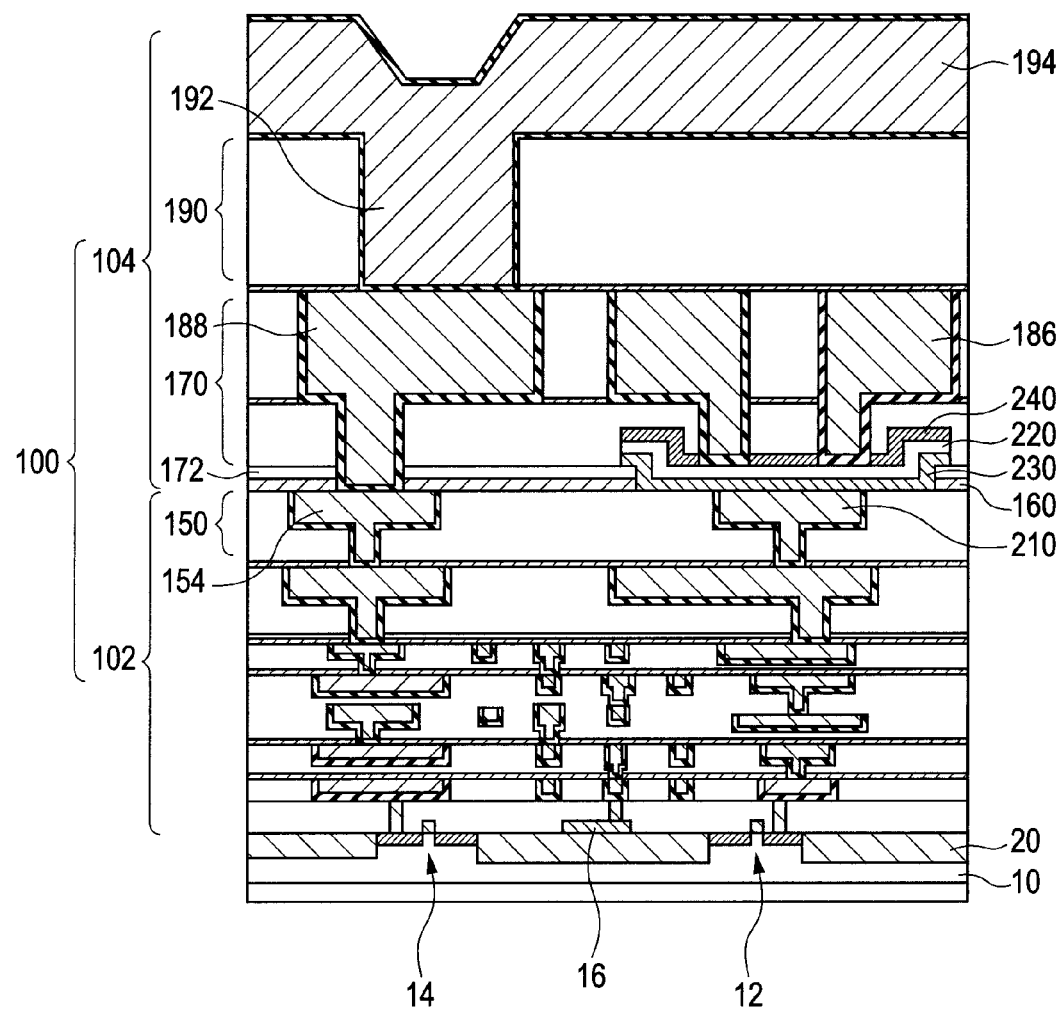
FIG. 22 is a sectional view showing the configuration of a semiconductor device according to Tenth Embodiment.

FIG. 22 is a sectional view showing the configuration of a semiconductor device according to Tenth Embodiment. The semiconductor device has a semiconductor substrate 10 and a multilayer wiring layer 100.

A device isolation film 20 and transistors 12 and 14 are formed in the semiconductor substrate 10. Further, a passive element (for example, a resistance element) 16 is formed over the device isolation film 20. The passive element 16 is formed through an identical step to the gate electrode of the transistor 12.

At least one of a transistor 200 shown in First to Seventh Embodiments, a capacitive element 202 shown in Eighth Embodiment, and a diode 204 shown in Ninth Embodiment is formed in the multilayer wiring layer 100. In the example shown in the figure, a transistor 200 shown in Fourth Embodiment (FIG. 11) is formed. The planar shape of the transistor 200 is larger than the planar shape of the transistors 12 and 14. Here, the semiconductor device has a diode 204 in an identical layer to the transistor 200 although it is not shown in the figure.

In the example shown in the figure, a first wiring layer 150 is located in the uppermost layer of a local wiring layer 102 as a wiring layer for forming a circuit and a second wiring layer 170 is located in the lowermost layer of a global wiring layer 104 as a wire for wiring an electric power source wire and a grounding wire. A wire 194 is formed over the second wiring layer 170 through an interlayer insulation film 190. The wire 194 is an Al wire and is coupled to a wire (for example, a wire 188) of the second wiring layer 170 through a via 192. A barrier metal film is formed each of the bottom face and the top face of the wire 194. The barrier metal film is a metal film containing Ti as the main component, a nitride film of the metal, or a laminated film of the metal film and the nitride film. Here, in the layer identical to the wire 194, electrode pads (electric source pads 400, a grounding pad 402, and I/O pads 410 that will be described later) are formed.

Here, each of the wiring layers including the local wiring layer 102 is thinner than each of the wiring layers comprising of the global wiring layer 104. Then each of the wires in the local wiring layer 102 is also thinner than each of the wires in the global wiring layer 104.

A drain (or source) of the transistor 14 is coupled to a first wire 154 through wires and vias formed in the local wiring layer 102. A drain of the transistor 12 is coupled to a gate electrode 210 through wires and vias formed in the local wiring layer 102. The transistors 12 and 14 configure internal circuits 300 and 302 that will be described later. Here, the transistor 12 overlaps with a semiconductor film 220 of a transistor 200 in a planar view.

Figure 23:
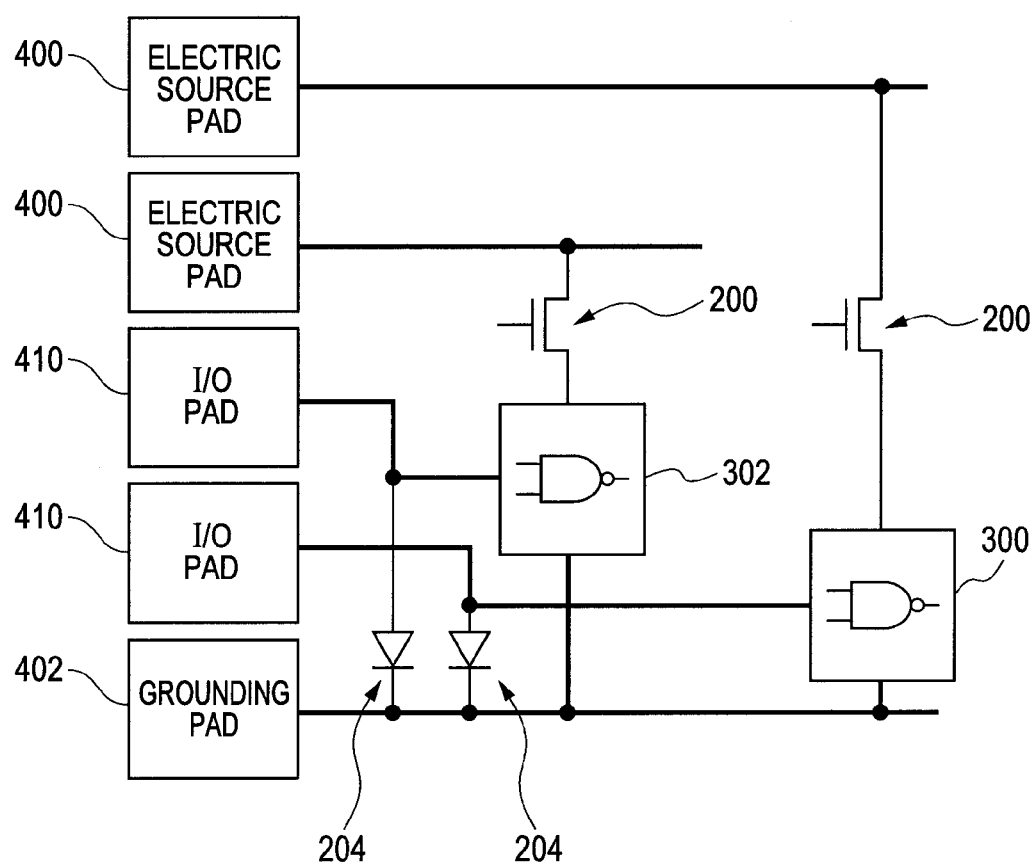
FIG. 23 is a circuit diagram of the semiconductor device shown in FIG. 22.

FIG. 23 is a circuit diagram of the semiconductor device shown in FIG. 22. In the present embodiment, the semiconductor device has electric source pads 400, a grounding pad 402, and I/O pads 410. The electric source pads 400 are pads for supplying electric source voltage (Vdd) to the semiconductor device and the grounding pad 402 is a pad for supplying ground potential to the semiconductor device. The I/O pads 410 are pads for inputting and outputting a signal into and from the semiconductor device.

Internal circuits 300 and 302 are formed in the semiconductor device. Each of the internal circuits 300 and 302 is coupled to each of the electric source pads 400 through each of transistors 200. That is, the transistors 200 configure parts of an electric source circuit. In the present embodiment, the internal circuits 300 and 302 receive electric source voltages different from each other and hence are coupled to electric source pads 400 different from each other through transistors 200 different from each other.

Further, each of the internal circuits 300 and 302 is coupled to each of the I/O pads 410 and inputs and outputs a signal into and from exterior through each of the I/O pads 410. Each of the internal circuits 300 and 302 is coupled to the grounding pad 402. Then each of diodes 204 is coupled between each of the I/O pads 410 and the grounding pad 402 so that the direction from each of the I/O pads 410 toward the grounding pad 402 may represent a forward direction. That is, each of the diodes 204 is a protection element to protect the internal circuit 300 against an ESD or the like and is coupled to the internal circuit 300 in parallel.

Figure 24:
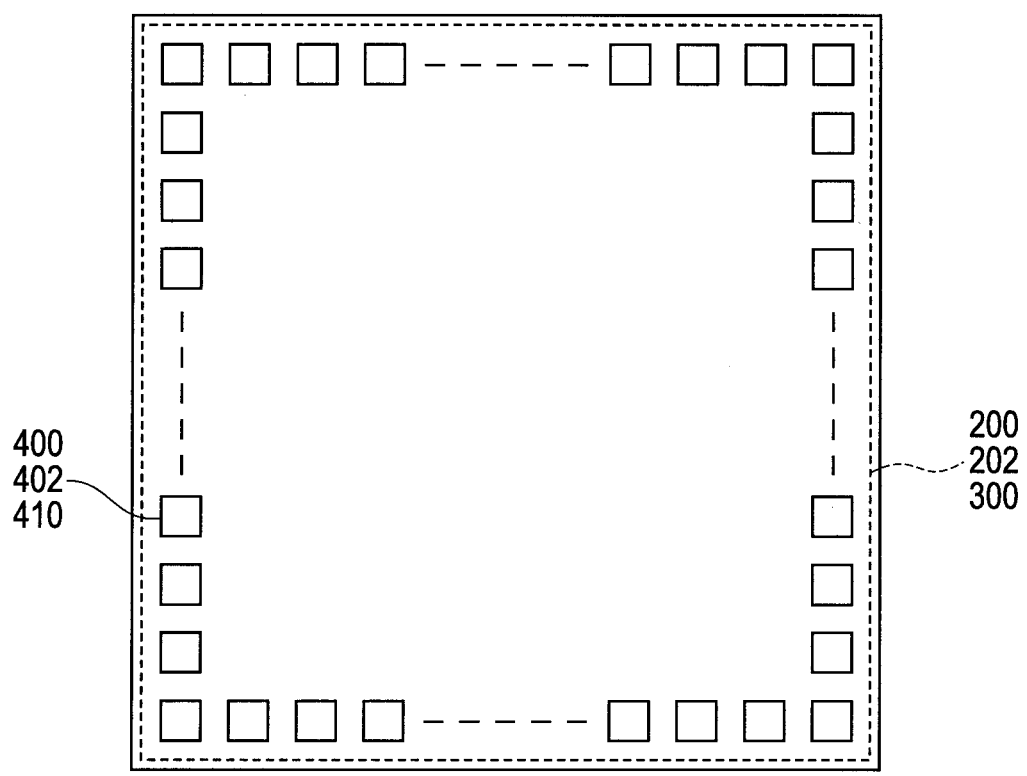
FIG. 24 is a plan view showing the whole configuration of the semiconductor device shown in FIGS. 22 and 23.

FIG. 24 is a plan view showing the whole configuration of the semiconductor device shown in FIGS. 22 and 23. As shown in the figure, the semiconductor device has a rectangular shape. A plurality of electric source pads are disposed along the sides. Each of the electric source pads is any one of an electric source pad 400, a grounding pad 402, and an I/O pad 410.

Further, in a planar view, the region where internal circuits 300, transistors 200, and capacitive elements 202 are formed includes therein the region surrounded by the electric source pads 400, the grounding pads 402, and the I/O pads 410. That is, the electric source pads 400, the grounding pads 402, and the I/O pads 410 overlap with the internal circuits 300, the transistors 200, and the capacitive elements 202.

Figure 25:
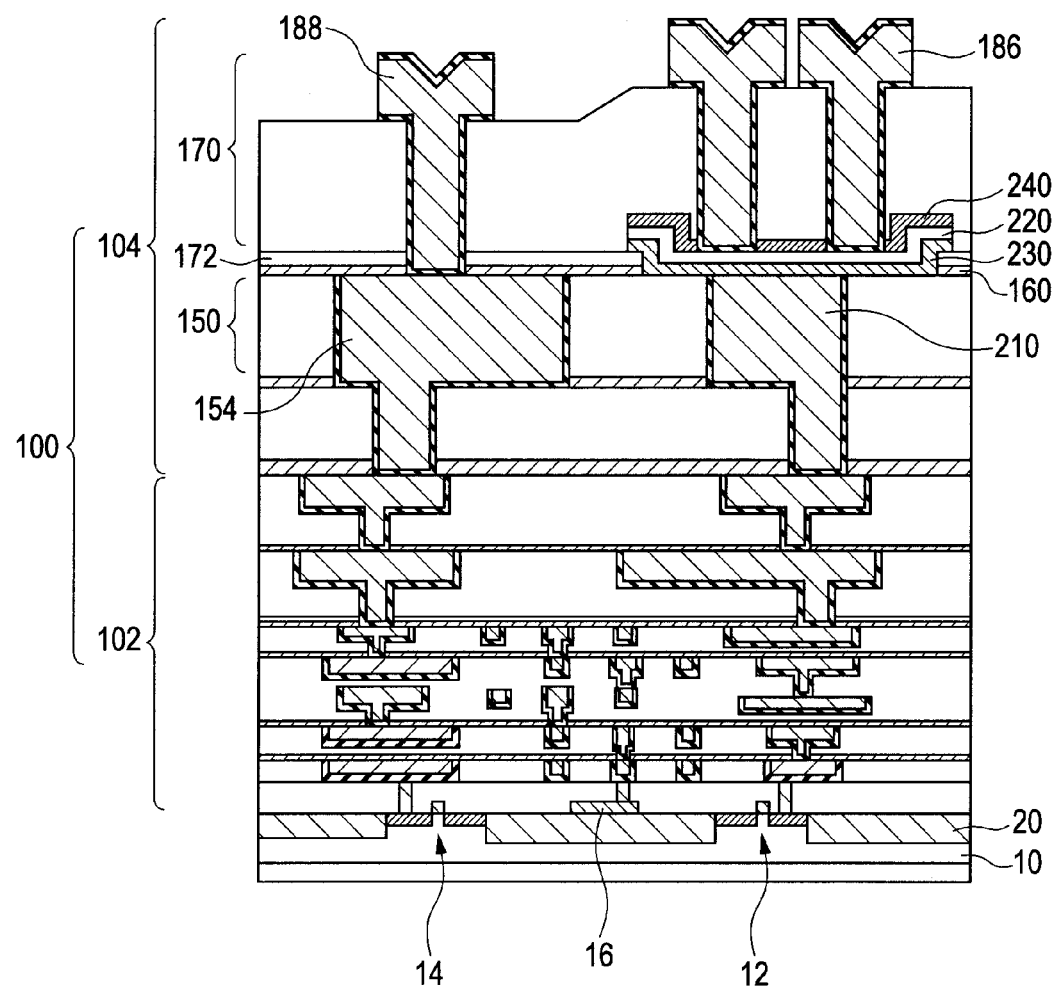
FIG. 25 is a view showing a modified example of FIG. 22.

FIG. 25 is a view showing a modified example of FIG. 22. In the figure, both a first wiring layer 150 and a second wiring layer 170 are formed in a global wiring layer 104. Then wires 188 and 186 are formed by Al wires. An electric source pad 400, a grounding pad 402, and an I/O pad 410 are formed in an identical layer to the wires 186 and 188.

In the present embodiment, electric source circuits of internal circuits 300 and 302 are configured with transistors 200 and diodes 204 are used as the protection elements of the internal circuits 300 and 302. Consequently, it is possible to overlap the internal circuits 300 and 302 with the electric source circuits and the protection elements in a planar view. As a result, it is possible to further downsize a semiconductor device.

Embodiments according to the present invention have heretofore been described in reference to drawings but those are examples of the present invention and it is also possible to adopt various configurations other than the above configurations.

What is claimed is:

1. A method for manufacturing a semiconductor device, comprising the steps of:
    forming a first interlayer insulation film over a semiconductor substrate;
    embedding a first wire and a gate electrode into said first interlayer insulation film;
    forming a diffusion prevention film over said first interlayer insulation film, over said first wire, and over said gate electrode;
    thinning a portion of the diffusion prevention film located over said gate electrode such that the thinned portion of the diffusion prevention film forms a recess over said gate electrode within a remaining portion of the diffusion prevention film;
    forming a semiconductor film in said recess of said diffusion prevention film and over said gate electrode;
    forming a second interlayer insulation film over said diffusion prevention film and over said semiconductor film; and
    forming vias coupled to said semiconductor film in said second interlayer insulation film.

2. The method for manufacturing a semiconductor device according to claim 1,
    wherein said semiconductor film is formed also over said diffusion prevention film in the step of forming said semiconductor film, and
    said method including, after the step of forming said semiconductor film and before the step of forming said second interlayer insulation film, the steps of:
        forming a hard mask pattern over said semiconductor film; and
        removing said semiconductor film located over said first wire by selectively removing said semiconductor film while said hard mask pattern is used as a mask.

3. The method for manufacturing a semiconductor device according to claim 1, including a step of:
    forming an insulation material layer comprising a different insulation material from said diffusion prevention film over said diffusion prevention film over said gate electrode between the step of thinning said diffusion prevention film and the step of forming said semiconductor film,
    wherein said semiconductor film is formed over said insulation material layer in the step of forming said semiconductor film.

4. A method for manufacturing a semiconductor device, comprising the steps of:
    forming a first interlayer insulation film over a semiconductor substrate;
    embedding a first wire and a gate electrode into said first interlayer insulation film;
    forming a diffusion prevention film over said first interlayer insulation film, over said first wire, and over said gate electrode;
    removing a portion of the diffusion prevention film located over said gate electrode such that an opening is formed in the diffusion prevention film wider than a width of the gate electrode at a location over said gate electrode;

providing, in the opening formed in the diffusion prevention film, an insulation material comprising a different insulation material from said diffusion prevention film;

forming a semiconductor film over said insulation material;

forming a second interlayer insulation film over said diffusion prevention film and over said semiconductor film; and forming vias coupled to said semiconductor film in said second interlayer insulation film.

5. The method for manufacturing a semiconductor device according to claim 3, wherein said insulation material layer is formed also over said diffusion prevention film in the step of forming said insulation material layer, and wherein said semiconductor film is formed also over said insulation material layer over said diffusion prevention film in the step of forming said semiconductor film, said method including, after the step of forming said semiconductor film and before the step of forming said second interlayer insulation film, the steps of:

forming a hard mask pattern over said semiconductor film; and removing said semiconductor film and said insulation material layer located over said first wire by selectively removing said semiconductor film, said insulation material layer while said hard mask pattern is used as a mask.

6. The method for manufacturing a semiconductor device according to claim 2, wherein the material of said hard mask pattern is identical to the material of said diffusion prevention film, and said hard mask pattern has a layer of an identical thickness to said diffusion prevention film.

7. The method for manufacturing a semiconductor device according to claim 4, wherein said insulation material is provided also at a location over said diffusion prevention film in the step of providing said insulation material, wherein said semiconductor film is formed also over said insulation material over said diffusion prevention film in the step of forming said semiconductor film, said method including, after the step of forming said semiconductor film and before the step of forming said second interlayer insulation film, the steps of:

forming a hard mask pattern over said semiconductor film; and removing said semiconductor film and said insulation material located over said first wire by selectively removing said semiconductor film, said insulation material while said hard mask pattern is used as a mask.

8. The method for manufacturing a semiconductor device according to claim 5, wherein the material of said hard mask pattern is identical to the material of said diffusion prevention film, and said second hard mask pattern has a layer of an identical thickness to said diffusion prevention film.

9. The method for manufacturing a semiconductor device according to claim 1, wherein the semiconductor film is formed over an entirety of said gate electrode.

10. The method for manufacturing a semiconductor device according to claim 4, wherein the semiconductor film is formed over an entirety of said gate electrode.

11. The method for manufacturing a semiconductor device according to claim 4, wherein a width of a layer formed by the insulation material is wider than the width of the gate electrode.

* * * * *